(12) United States Patent
Kamiya et al.

(10) Patent No.: US 11,445,304 B2
(45) Date of Patent: Sep. 13, 2022

(54) ULTRASONIC SENSOR

(71) Applicant: DENSO CORPORATION, Aichi-pref. (JP)

(72) Inventors: Tatsuya Kamiya, Kariya (JP); Itaru Ishii, Kariya (JP); Tomoki Tanemura, Kariya (JP); Takashi Aoki, Kariya (JP); Tetsuya Katoh, Kariya (JP)

(73) Assignee: DENSO CORPORATION, Kariya (JP)

( * ) Notice: Subject to any disclaimer, the term of this patent is extended or adjusted under 35 U.S.C. 154(b) by 161 days.

(21) Appl. No.: 16/837,258

(22) Filed: Apr. 1, 2020

(65) Prior Publication Data

US 2020/0322730 A1 Oct. 8, 2020

(30) Foreign Application Priority Data

Apr. 5, 2019 (JP) .............................. JP2019-072953

(51) Int. Cl.
*H04R 17/02* (2006.01)
*B81B 7/00* (2006.01)
*H04R 19/00* (2006.01)
*G01H 11/08* (2006.01)
*G01N 29/12* (2006.01)
*H04R 19/04* (2006.01)

(52) U.S. Cl.
CPC .......... *H04R 17/02* (2013.01); *B81B 7/0041* (2013.01); *G01H 11/08* (2013.01); *G01N 29/12* (2013.01); *H04R 19/005* (2013.01); *H04R 19/04* (2013.01); *B81B 2201/0257* (2013.01); *H04R 2499/13* (2013.01)

(58) Field of Classification Search
CPC .......... H04R 17/02; H04R 17/10; H04R 7/04; H04R 2499/13; H04R 19/005; H04R 19/04; H04R 2201/003; B81B 7/0041; B81B 2201/0257; G01H 11/08; G01H 11/00; G01N 29/12
USPC ........ 381/114, 175, 191, 113; 29/594, 609.1
See application file for complete search history.

(56) References Cited

U.S. PATENT DOCUMENTS

| | | |
|---|---|---|
| 2006/0043843 A1 | 3/2006 | Sugiura et al. |
| 2007/0040477 A1 | 2/2007 | Sugiura et al. |
| 2007/0144261 A1 | 6/2007 | Okuda et al. |
| 2008/0116765 A1 | 5/2008 | Sugiura et al. |
| 2011/0235841 A1 | 9/2011 | Tanaka et al. |
| 2011/0293128 A1 | 12/2011 | Kuratani et al. |

(Continued)

FOREIGN PATENT DOCUMENTS

| | | |
|---|---|---|
| JP | 59-218098 A | 12/1984 |
| JP | 2005-051687 A | 2/2005 |

(Continued)

*Primary Examiner* — Norman Yu
(74) *Attorney, Agent, or Firm* — Posz Law Group, PLC

(57) ABSTRACT

An ultrasonic sensor includes: an element storage case including a case-side diaphragm having a thickness direction along a directional axis; and an ultrasonic element accommodated in the element storage case and spaced apart from the case-side diaphragm. The ultrasonic element includes an element-side diaphragm having the thickness direction along the directional axis and provided by a thin part of a semiconductor substrate. The semiconductor substrate is arranged to provide a closed space between the case-side diaphragm and the element-side diaphragm. The semiconductor substrate is fixed and supported by the element-storage case.

18 Claims, 21 Drawing Sheets

(56) References Cited

U.S. PATENT DOCUMENTS

| | | | |
|---|---|---|---|
| 2012/0001275 A1* | 1/2012 | Chi | H04R 17/02 |
| | | | 438/51 |
| 2013/0308425 A1* | 11/2013 | Nakamura | H01L 41/053 |
| | | | 367/87 |
| 2015/0082888 A1 | 3/2015 | Otsu et al. | |
| 2017/0111720 A1* | 4/2017 | Miehl | H04R 1/283 |
| 2017/0146393 A1 | 5/2017 | Otsu et al. | |
| 2017/0214994 A1* | 7/2017 | Gadonniex | H04R 1/105 |
| 2017/0230756 A1* | 8/2017 | Schelling | H04R 1/2803 |
| 2017/0280218 A1* | 9/2017 | Wang | H04R 1/023 |
| 2020/0152857 A1* | 5/2020 | Ohashi | H04R 17/00 |

FOREIGN PATENT DOCUMENTS

| | | |
|---|---|---|
| JP | 2009-058298 A | 3/2009 |
| JP | 2011-250327 A | 12/2011 |
| JP | 5004840 B2 | 8/2012 |
| JP | 2016-058880 A | 4/2016 |
| JP | 2016-146515 A | 8/2016 |

* cited by examiner

ULTRASONIC SENSOR

CROSS REFERENCE TO RELATED APPLICATION

The present application claims the benefit of priority from Japanese Patent Application No. 2019-072953 filed on Apr. 5, 2019. The entire disclosure of the above application is incorporated herein by reference.

TECHNICAL FIELD

The present disclosure relates to an ultrasonic sensor.

BACKGROUND

An ultrasonic sensor includes a case and a piezoelectric element. The case is shaped like a bottomed cylinder having a bottom and a lateral wall. The piezoelectric element is bonded to the bottom of the case.

SUMMARY

According to an example embodiment, an ultrasonic sensor includes: an element storage case including a case-side diaphragm having a thickness direction along a directional axis; and an ultrasonic element accommodated in the element storage case and spaced apart from the case-side diaphragm. The ultrasonic element includes an element-side diaphragm having the thickness direction along the directional axis and provided by a thin part of a semiconductor substrate. The semiconductor substrate is arranged to provide a closed space between the case-side diaphragm and the element-side diaphragm. The semiconductor substrate is fixed and supported by the element-storage case.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
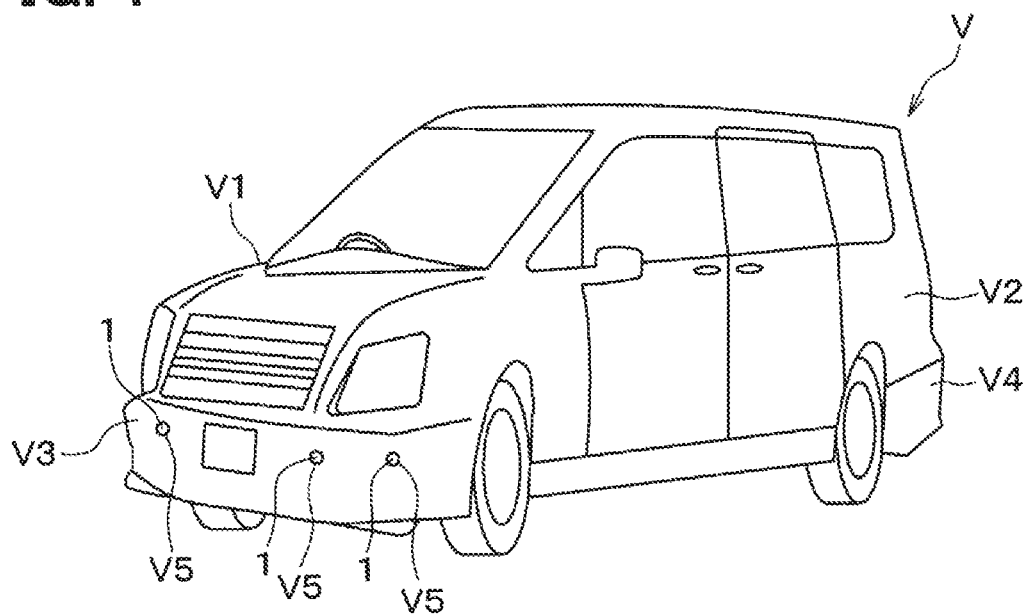
FIG. 1 is an oblique drawing of an appearance of a vehicle including an ultrasonic sensor according to an embodiment.

In a conceivable ultrasonic sensor, a case accommodating an ultrasonic element such as the piezoelectric element is exposed to an external space where an object of detection exists. More specifically, for example, when installed in a vehicle, the ultrasonic sensor is mounted in an outer panel member such as a bumper of the vehicle in an onboard state. Therefore, a hard foreign matter such as a pebble may collide with the case.

In the case of the existing ultrasonic sensor, there is a concern that a crack may occur in the ultrasonic element bonded to the case or the ultrasonic element may peel off from the case. In particular, when a MEMS type element is employed, bonding the element to the bottom of the case makes the element prone to be damaged. Herein, MEMS stands for Micro Electro Mechanical Systems.

In view of the above points, an ultrasonic element, for example, is satisfactorily protected.

According to an aspect of an example embodiment, an ultrasonic sensor includes: an element storage case including at least one case-side diaphragm that is a vibration plate having a thickness direction along a directional axis; and at least one ultrasonic element accommodated in the element storage case and spaced apart from the case-side diaphragm. The ultrasonic element includes an element-side diaphragm that is a vibration film having the thickness direction along the directional axis and provided by a thin part of a semiconductor substrate having the thickness direction along the directional axis. The semiconductor substrate is arranged to provide at least one closed space as a resonant space between the case-side diaphragm and the element-side diaphragm. The semiconductor substrate is fixed and supported by the element-storage case.

The ultrasonic element is stored inside the element storage case, and dissociated from the case-side diaphragm included in the element storage case. Therefore, even when a hard foreign matter such as a pebble collides with the case-side diaphragm, an impact stemming from the collision does not directly act on the ultrasonic element. Therefore, the ultrasonic element is satisfactorily protected by the element storage case.

The element-side diaphragm included in the ultrasonic element is the thin part of the semiconductor substrate fixedly supported by the element storage case. The closed space that is a resonant space is interposed between the element-side diaphragm and the case-side diaphragm. Therefore, an ultrasonic vibration caused by one of the ultrasonic element and the case-side diaphragm propagates to the other one owing to linkage resonance. Therefore, the efficiency in propagating the ultrasonic vibration between the ultrasonic element and the case-side diaphragm improves.

According to the above constitution, while the ultrasonic element is satisfactorily protected, propagation of an ultrasonic vibration between the external space of the ultrasonic sensor and the ultrasonic element can be successfully realized.

Embodiments

Embodiments of the present invention will be described below in conjunction with the drawings. As for diverse modifications adaptable to one embodiment, when the modifications are inserted to the middle of a series of explanations concerning the embodiment, there is a possibility that understanding the embodiment may be hampered. Therefore, the modifications will not be inserted into the middle of the series of explanations concerning the embodiment, but will be described altogether later.

Onboard Constitution

Referring to FIG. 1, in the present embodiment, an ultrasonic sensor 1 has a constitution as an onboard clearance sonar to be installed in a vehicle V. Specifically, the ultrasonic sensor 1 can detect an object existing around the vehicle V when installed in the vehicle V.

The vehicle V is a so-called four-wheeled automobile and has a boxy vehicle body V1. The vehicle body V1 includes a body panel V2, a front bumper V3, and a rear bumper V4 which are body components constituting an outer panel. The front bumper V3 is disposed at a front end of the vehicle body V1. The rear bumper V4 is disposed at a rear end of the vehicle body V1.

The ultrasonic sensor 1 is mounted in the front bumper V3 and the rear bumper V4 in order to detect an object existing ahead of or behind the vehicle V. A state of having the ultrasonic sensor 1 mounted in the front bumper V3 and the rear bumper V4 included in the vehicle body V1 of the vehicle V is hereinafter called an "onboard state".

More specifically, in the onboard state, plural (for example, four) ultrasonic sensors 1 are mounted in the front bumper V3. The plural ultrasonic sensors 1 mounted in the front bumper V3 are located at different positions in a vehicle width direction. Likewise, plural (for example, four) ultrasonic sensors 1 are mounted in the rear bumper V4. The front bumper V3 and the rear bumper V4 have mounting holes V5 that are through holes for use in mounting the respective ultrasonic sensors 1.

First Embodiment

Figure 2:
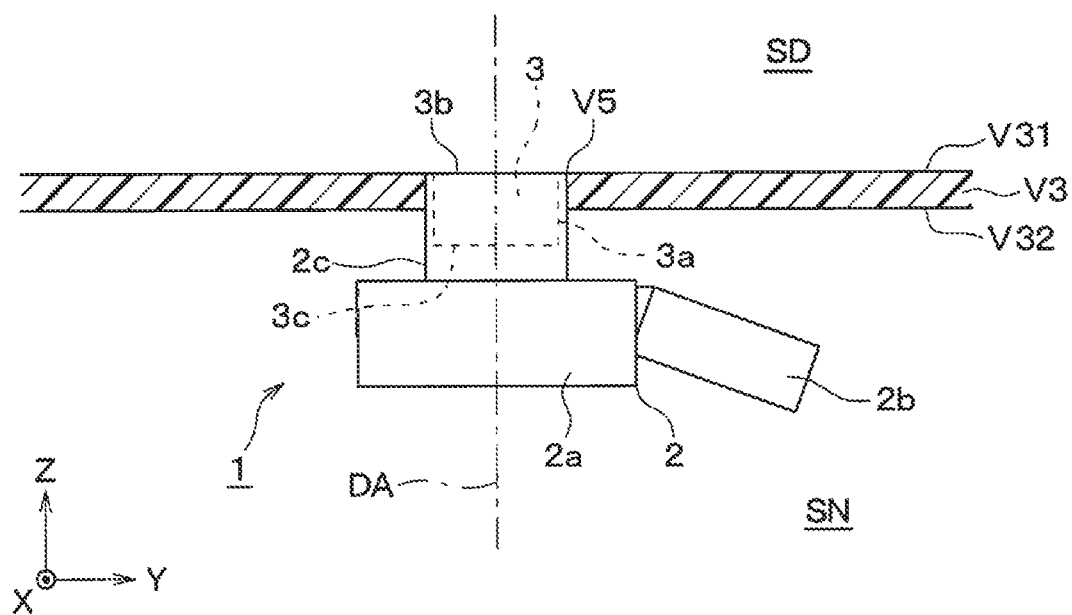
FIG. 2 is a partially sectional view showing in enlargement the surroundings of the ultrasonic sensor shown in FIG. 1.
Figure 3:
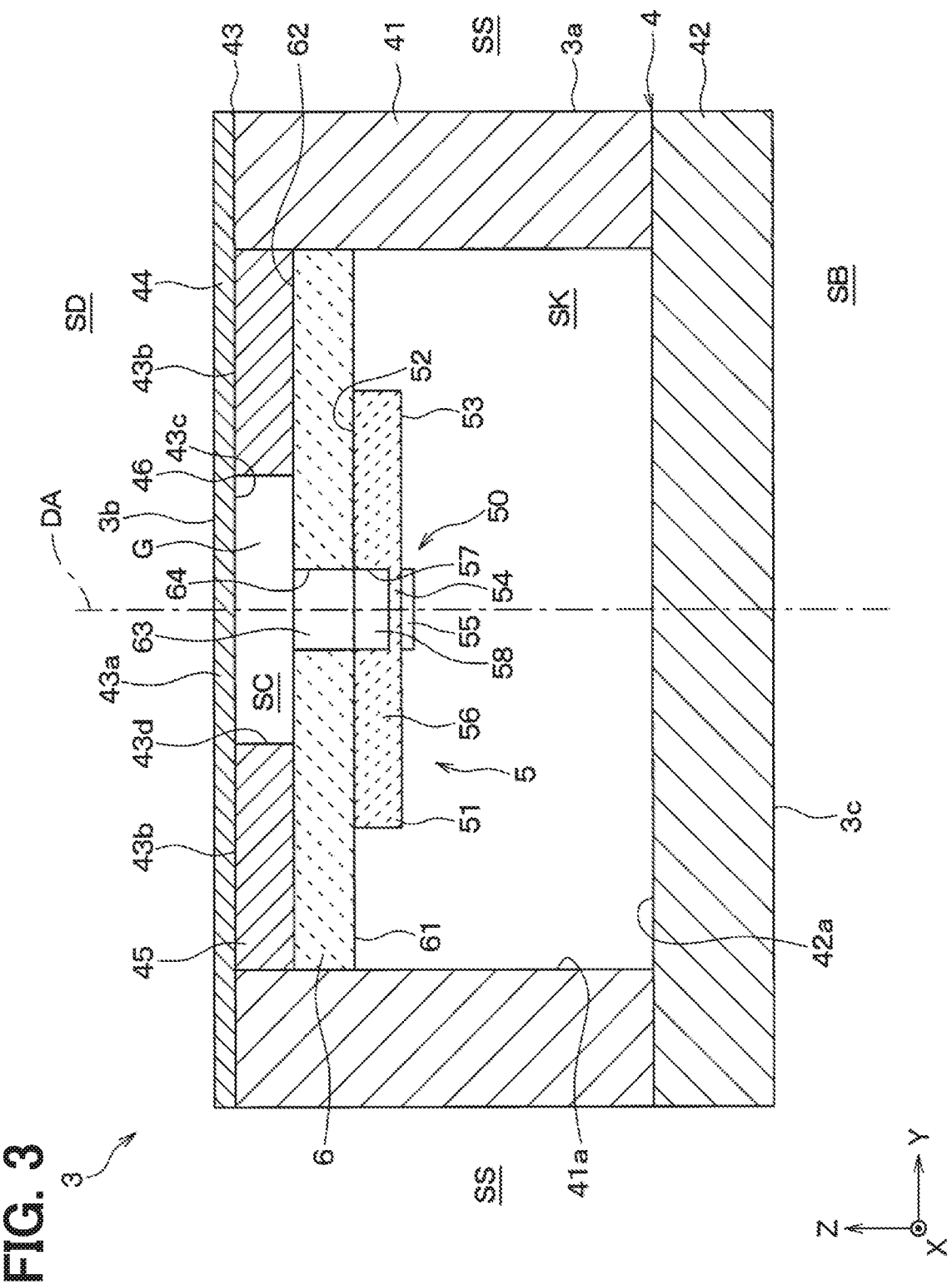
FIG. 3 is a sectional view showing an outline constitution of an ultrasonic microphone shown in FIG. 2.

FIG. 2 shows in the onboard state one of plural ultrasonic sensors 1 attached to the front bumper V3. Referring to FIG. 2 and FIG. 3, the constitution of the ultrasonic sensor 1 according to a first embodiment will be described below.

Referring to FIG. 2, the front bumper V3 includes a bumper periphery V31 and a bumper back V32. The bumper periphery V31 is an external surface of the front bumper V3, and faces an external space SD that is a space outside the vehicle V The bumper back V32 is a back surface of the bumper periphery V31, and faces a body interior space SN that is a space inside the vehicle V, that is, front bumper V3. A mounting hole V5 opens on the bumper periphery V31 and the bumper back V32, and thus pierces the front bumper V3 in a thickness direction.

The ultrasonic sensor 1 can transmit or receive an ultrasonic wave. Specifically, the ultrasonic sensor 1 transmits a probe wave, which is an ultrasonic wave, to the external space SD along a directional axis DA. The directional axis pertains to a virtual straight line extending from the ultrasonic sensor 1 in a transmitting or receiving direction of the ultrasonic wave, and serves as a reference for a directional angle. The directional axis may be called a directional center axis or detection axis. The ultrasonic sensor 1 receives a receiving wave, which includes a reflected wave of a probe wave returned from an object existing in the surroundings, from the external space SD, and generates and outputs a detection signal based on a result of receiving.

For brevity's sake, as illustrated, a right-handed XYZ orthogonal coordinate system is defined so that the Z axis is parallel to the directional axis DA. At this time, a direction parallel to the directional axis DA is called a "directional-axis direction". "A distal side in the directional-axis direction" pertains to a side of a transmitting direction of a probe wave, and corresponds to an upper side, that is, Z-axis positive direction side in FIG. 2 and FIG. 3 alike. In contrast, "a proximal side in the directional-axis direction" corresponds to a lower side, that is, Z-axis negative direction side in FIG. 2 and FIG. 3 alike.

An end of a proximal side in the directional-axis direction of a certain constituent element is called a "proximal end", and an end of a distal side in the directional-axis direction is called a "distal end". An arbitrary direction orthogonal to the directional-axis direction is called an "in-plane direction". The "in-plane direction" is a direction parallel to the XY plane in FIG. 2 and FIG. 3. The "in-plane direction" may be called a radial direction in some cases. The "radial direction" is a direction in which a half line extends in the event that the half line is drawn in a virtual plane with an intersection between the virtual plane orthogonal to the directional axis DA and the directional axis DA as an origin. In other words, the "radial direction" is a radial direction of a circle in the event that the circle is drawn in the virtual plane with the intersection between the virtual plane orthogonal to the directional axis DA and the directional axis DA as a center.

The ultrasonic sensor 1 includes a sensor case 2 and an ultrasonic microphone 3. The sensor case 2 is a part or part group forming a housing of the ultrasonic sensor 1, and is made of an insulating synthetic resin. More specifically, the sensor case 2 includes a case main unit 2a, a sensor-side connector 2b, and a microphone storage 2c.

The case main unit 2a is shaped like a box. A control circuit board or the like that is not shown is stored inside the case main unit 2a. The sensor-side connector 2b is extended from the case main unit 2a in a direction intersecting the directional axis DA. The sensor-side connector 2b can be detachably attached to a wire-side connector which is not shown and included in an electricity connection harness for external equipment such as an ECU. Herein, ECU stands for Electronic Control Unit.

The microphone storage 2c is a substantially cylindrical part encircling the directional axis DA, and jutted out from the case main unit 2a towards the distal side in the directional-axis direction. In the onboard state, the distal end of the microphone storage 2c is stowed in the mounting hole V5 so as to come into close contact with the inner wall surface of the mounting hole V5.

Ultrasonic Microphone

The ultrasonic microphone 3 is stored in the microphone storage 2c. The ultrasonic microphone 3 has a substantially cylindrical outline.

The external surface of the ultrasonic microphone 3 includes a laterally outer wall surface 3a, a bare surface 3b, and an outside bottom 3c. The laterally outer wall surface 3a is shaped like a cylindrical surface existent in the directional-axis direction.

A sleeve member that is not shown is interposed between the inner wall surface of the microphone storage 2c and the laterally outer wall surface 3a of the ultrasonic microphone 3. The sleeve member is made of a silicon rubber exhibiting insulation and rubber resilience. Specifically, a gap between the inner wall surface of the microphone storage 2c and the laterally outer wall surface 3a is sealed by the sleeve member in such a manner that water hardly enters.

The bare surface 3b is an external surface intersecting the directional axis DA and shaped like a flat circular plane. More specifically, in the present embodiment, the bare surface 3b is orthogonal to the directional axis DA. The ultrasonic microphone 3 is stored in the microphone storage 2c so that the bare surface 3b is exposed to the external space SD through the mounting hole V5 in the onboard state. The bare surface 3b is a surface through which a probe wave is radiated to the external space SD and against which a receiving wave is hit. Therefore, the bare surface 3b may be called a "transmitting/receiving surface".

The outside bottom 3c is an external surface intersecting the directional axis DA and shaped like a flat circular plane. More specifically, in the present embodiment, the outside bottom 3c is orthogonal to the directional axis DA. In other words, the outside bottom 3c is formed as a plane parallel to the bare surface 3b. The proximal end in the directional-axis direction of the ultrasonic microphone 3 which includes the outside bottom 3c is liquid-tightly shielded with the sensor case 2 and the sleeve member in an assembled state. The "assembled state" pertains to a state in which the ultrasonic microphone 3 is mounted in the sensor case 2.

FIG. 3 shows a state in which the ultrasonic microphone 3 is dismounted from the ultrasonic sensor 1 shown in FIG. 2. Referring to FIG. 3, the ultrasonic microphone 3 includes an element storage case 4, a transducer unit 5, and a support substrate 6. Parts constituting the ultrasonic microphone 3 will be described below. For brevity's sake, an illustration and explanation of an electric connection structure including a wiring in the ultrasonic microphone 3 will be omitted. Likewise, an illustration and explanation of an electric connection structure including terminals and a wiring and being used to electrically connect the ultrasonic microphone 3 to a control circuit board in the sensor case 2 will be omitted. Needless to say, the electric connection structures can be properly constructed based on common technical knowledge available at the time of filing the application concerned.

The element storage case 4 is part serving as an outside housing of the ultrasonic microphone 3 and shaped like a box having a substantially cylindrical outline. The element storage case 4 accommodates the transducer unit 5 and the support substrate 6 in a substrate back space SK that is an internal space. In the present embodiment, the element storage case 4 is made of a metal material such as aluminum. As described later, the material to be made into the element storage case 4 is not limited to the metal material such as aluminum.

The element storage case 4 has a lateral plate 41 shaped like a cylinder encircling the directional axis DA. In the present embodiment, the lateral plate 41 is shaped like a cylinder having a center axis line substantially parallel to the directional axis DA. The lateral plate 41 includes the laterally outer wall surface 3a facing a case lateral space SS, and a laterally inner wall surface 41a facing the substrate back space SK. The laterally inner wall surface 41a is an inner wall surface of the lateral plate 41, and is shaped like a cylindrical internal surface encircling the directional axis DA.

The element storage case 4 has an inside baseplate 42. The inside baseplate 42 is shaped like a plate having a thickness direction along the directional axis DA. The inside baseplate 42 blocks one side of the lateral plate 41, that is, the proximal side in the directional-axis direction. The inside baseplate 42 includes the outside bottom 3c that is a principal surface facing the case back space SB, and an inside bottom 42a that is a principal surface facing the substrate back space SK. Herein, the "principal surface" pertains to a surface orthogonal to the thickness direction of a plate-like part. The case back space SB is a space outside the element storage case 4 located on the proximal side in the directional-axis direction beyond the element storage case 4. In other words, the case back space SB is occupied by the microphone storage 2c and the sleeve member in the assembled state. The inside bottom 42a is shaped like a flat circular plane orthogonal to the directional-axis direction DA. More specifically, in the present embodiment, the inside bottom 42a is orthogonal to the directional axis DA.

The element storage case 4 further includes an outside baseplate 43. The outside baseplate 43 is shaped like a plate having a thickness direction along the directional axis DA. The outside baseplate 43 liquid-tightly blocks the other side of the lateral plate 41, that is, the distal side in the directional-axis direction for fear that water or any other liquid may enter a closed space SC to be described later. The outside baseplate 43 may be called a top plate.

The outside baseplate 43 has a case-side diaphragm 43a that is a vibration plate having a thickness direction along the directional axis DA. The case-side diaphragm 43a warps to make an ultrasonic vibration when the transducer unit 5 transmits or receives an ultrasonic wave. Specifically, the case-side diaphragm 43a makes an ultrasonic vibration in such a manner that the center in the in-plane direction moves in the directional-axis direction. In the present embodiment, the shape in the in-plane direction of the case-side diaphragm 43a, that is, the shape in a plane orthogonal to the directional axis DA is substantially circular.

The case-side diaphragm 43a is formed as a thin part in the center in the in-plane direction of the outside baseplate 43. In other words, the outside baseplate 43 includes the case-side diaphragm 43a and the case-side thick part 43b.

The case-side thick part 43b is a thick part of the outside baseplate 43, and disposed radially outwardly of the case-side diaphragm 43a. The case-side thick part 43b surrounds the perimeter of the case-side diaphragm 43a. The case-side thick part 43b fixedly supports an edge in the radial direction of the case-side diaphragm 43a.

The outside baseplate 43 has the bare surface 3b that is a principal surface orthogonal to the thickness direction. In other words, the center in the in-plane direction of the bare surface 3b serves as an external surface of the case-side diaphragm 43a facing the external space SD.

The outside baseplate 43 includes a diaphragm back 43c and a gap inner wall surface 43d. The diaphragm back 43c is an internal surface of the case-side diaphragm 43a, and intersects the directional axis DA on the back side of the bare surface 3b. More specifically, in the present embodiment, the diaphragm back 43c is shaped like a flat circular plane orthogonal to the directional axis DA. In other words, the diaphragm back 43c is an inner wall surface forming a ceiling of the closed space SC to be described later, and is oriented to the proximal side in the directional-axis direction. The gap inner wall surface 43d serves as a sidewall surface inside of the case-side thick part 43b facing the closed space SC, and is shaped like a cylindrical internal surface encircling the directional axis DA.

In consideration of the fact that the ultrasonic sensor 1 is of an onboard type, the lateral plate 41 and the outside baseplate 43 have a thickness of 0.5 mm or more. Specifically, the case-side diaphragm 43a is shaped like a plate having a certain thickness of 0.5 mm or more. In the present embodiment, the outside baseplate 43 is formed so that the bare surface 3b which is an outside surface, that is, a surface on the distal side in the directional-axis direction is planar. In other words, the outside surfaces of the case-side diaphragm 43a and the case-side thick part 43b are flush with each other. The case-side diaphragm 43a is included on one side in the thickness direction of the outside baseplate 43.

More specifically, in the present embodiment, the outside baseplate 43 has a structure having a diaphragm formation part 44 and a diaphragm support part 45 joined with each other. The diaphragm formation part 44 is shaped like a thin plate having a uniform thickness corresponding to the thickness of the case-side diaphragm 43a. The diaphragm support part 45 is shaped like a plate thicker than the diaphragm formation part 44. The diaphragm support part 45 has a gap formation hole 46 that is a through hole corresponding to the gap inner wall surface 43d. Specifically, the gap inner wall surface 43d serves as an inner wall surface of the gap formation hole 46.

The transducer unit 5 includes an ultrasonic element 50 having a feature of converting an electric signal to an ultrasonic vibration or vice versa. The ultrasonic element 50 is stored inside the element storage case 4 and dissociated from the case-side diaphragm 43a. In the present embodiment, the transducer unit 5 has a constitution as a MEMS type piezoelectric transducer. Specifically, the ultrasonic element 50 is a MEMS type element mounted on a semiconductor substrate 51.

The semiconductor substrate 51 is a SOI substrate having a thickness direction along the directional axis DA, and is fixedly supported by the case-side thick part 43b. Herein, SOI stands for Silicon-On-Insulator. More specifically, the semiconductor substrate 51 is joined with the support substrate 6 secured to the case-side thick part 43b, and secured to the support substrate 6. Specifically, the semiconductor substrate 51 is fixedly joined with the case-side thick part 43b via the support substrate 6.

The semiconductor substrate 51 has a substrate bottom 52 and an element support surface 53 that are a pair of principal surfaces. The substrate bottom 52 is shaped like a flat plane. The substrate bottom 52 is joined with the support substrate 6 using an adhesive layer that is not shown, and thereby the semiconductor substrate 51 is secured to the support substrate 6. The element support surface 53 is a principal surface bearing the ultrasonic element 50, and is shaped like a plane. The element support surface 53 faces the substrate back space SK.

The semiconductor substrate 51 includes an element-side diaphragm 54. The element-side diaphragm 54 is a diaphragm having a film thickness direction along the directional axis DA, and is formed as a thin part of the semiconductor substrate 51. The element support surface 53 serves as an external surface of the element-side diaphragm 54. Specifically, the element-side diaphragm 54 is included on one side in the thickness direction of the semiconductor substrate 51 so that the element support surface 53 is shaped like a plane. The element-side diaphragm 54 warps to make an ultrasonic vibration when the transducer unit 5 transmits or receives an ultrasonic wave. Specifically, the element-side diaphragm 54 makes an ultrasonic vibration in the same direction as the case-side diaphragm 43a does in such a manner that the center part in the in-plane direction moves in the directional-axis direction.

The ultrasonic element 50 includes the element-side diaphragm 54 and an element part 55. The element part 55 is disposed on the element-side diaphragm 54. In the present embodiment, the element part 55 is a piezoelectric element having a piezoelectric film and a thin-film electrode layered, and secured to the element support surface 53. Specifically, the ultrasonic element 50 has a constitution as a PMUT. Herein, PMUT stands for Piezoelectric Micromachined Ultrasonic Transducers.

The ultrasonic element 50 is designed so that the element-side diaphragm 54 makes an ultrasonic vibration according to a drive voltage that is an ac voltage applied to the element part 55. Further, the ultrasonic element 50 is designed so that the element part 55 generates an output voltage according to the vibrational state of the element-side diaphragm 54.

The element-side diaphragm 54 links the edges of the element-side thick part 56 which are opposed to each other in the in-plane direction. Specifically, the element-side thick part 56 is a thick part adjoining the element-side diaphragm 54 in the in-plane direction, and has a predetermined thickness larger than the thickness of the element-side diaphragm 54.

The semiconductor substrate 51 has an element-side recessed part 57. The element-side recessed part 57 is a recessed part located at a position coincident with the element-side diaphragm 54 in the in-plane direction, and opens in the directional-axis direction. Specifically, the element-side recessed part 57 is surrounded by the element-side thick part 56.

In the present embodiment, the element-side recessed part 57 opens on the support substrate 6. Specifically, an element-side hollow part 58 that is a space inside the element-side recessed part 57 is shielded from the substrate back space SK by the element-side diaphragm 54 and the element-side thick part 56.

The support substrate 6 is a member that fixedly supports the transducer unit 5 having the ultrasonic element 50, and is shaped like a plate having a thickness direction along the directional axis DA. The support substrate 6 is interposed between the outside baseplate 43 and the semiconductor substrate 51. The support substrate 6 has a mounting surface 61 and a case fixation surface 62 that are a pair of principal surfaces.

The mounting surface 61 faces the substrate back space SK. The semiconductor substrate 51 is secured to the top of the mounting surface 61. Electrode pads that are not shown and disposed on the perimeter of the semiconductor substrate 51 on the mounting surface 61, and electrode pads that are not shown and disposed in the transducer unit 5 are electrically interconnected over a wire such as a bonding wire.

The support substrate 6 is joined with the case-side thick part 43b of the outside baseplate 43, and secured to the element storage case 4. More specifically, the case fixation surface 62 is secured to the case-side thick part 43b of the outside baseplate 43 using an adhesive layer that is not shown. A gap G is interposed between the case fixation surface 62 and the case-side diaphragm 43a. In other words, the gap G is a cavity interposed between the case-side diaphragm 43a and the support substrate 6.

The support substrate 6 has a communication hole 63. The communication hole 63 is a through hole piercing the support substrate 6 in the thickness direction, and opens on the mounting surface 61 and the case fixation surface 62. The communication hole 63 is shaped like a round hole encircling the directional axis DA. In other words, the communication hole 63 has a substrate inner wall surface 64 that is an inner wall surface shaped like a cylindrical internal surface.

In the present embodiment, the support substrate 6 is joined with the semiconductor substrate 51 so that the communication hole 63 adjoins and communicates with the element-side recessed part 57. Specifically, the communication hole 63 communicates with the element-side hollow part 58 included in the semiconductor substrate 51, Further, the communication hole 63 also communicates with the gap G. Specifically, the communication hole 63 allows the gap G and the element-side hollow part 58 to communicate with each other while being interposed between the gap and the element-side hollow part. The element-side hollow part 58, the gap G, and the communication hole 63 constitute the closed space SC.

The closed space SC is formed in the interior of a joint entity including the outside baseplate 43, the semiconductor substrate 51, and the support substrate 6. In other words, the closed space SC is surrounded by the diaphragm back 43c, the gap inner wall surface 43d, the substrate inner wall surface 64, and the element-side recessed part 57, The closed space SC is interposed between the case-side diaphragm 43a and the element-side diaphragm 54. The closed space SC is located on a side opposite to the substrate back space SK with the semiconductor substrate 51 between the closed space and the substrate back space. The "closed space" signifies an unopen space that does not have a communication hole communicating with the outside. In the present embodiment, the closed space SC is formed as an airtightly and the liquid-tightly sealed space.

As mentioned above, the semiconductor substrate 51 is disposed so that the closed space SC is created between the case-side diaphragm 43a and the element-side diaphragm 54, and is fixedly supported by the element storage case 4. The closed space SC has a feature as a resonant space included in the element storage case 4. Specifically, the closed space SC is formed so that an ultrasonic vibration propagates between the case-side diaphragm 43a and the element-side diaphragm 54 owing to linkage resonance.

In the present embodiment, the closed space SC is formed so that a spatial sectional area varies in the directional-axis direction. The "spatial sectional area" pertains to a sectional area on a plane orthogonal to the directional axis DA in the closed space SC. More specifically, the closed space SC has the smallest spatial sectional area in the element-side hollow part 58 and the largest spatial sectional area in the gap G. The spatial sectional area of the communication hole 63 is equal to or larger than that of the element-side hollow part 58 and falls below that of the gap G. In other words, the communication hole 63 is formed for fear that the substrate inner wall surface 64 which is the inner wall surface of the communication hole may lie inside the element-side recessed part 57 in the radial direction.

The ultrasonic microphone 3 is designed so that the resonant frequencies of the ultrasonic element 50, closed space SC, and case-side diaphragm 43a respectively range from 30 kHz to 100 kHz. The ultrasonic microphone 3 is designed so that a first resonant frequency, second resonant frequency, and third resonant frequency agree with one another. The first resonant frequency is a resonant frequency, that is, structural resonant frequency of the ultrasonic element 50. The second resonant frequency is a resonant frequency, that is, sympathetic resonance frequency of the closed space SC. The third resonant frequency is a resonant frequency, that is, structural resonant frequency of the case-side diaphragm 43a.

More specifically, the ultrasonic microphone 3 is designed to meet $\Delta fr \leq BW$. Herein, $\Delta fr$ denotes a maximum value among a difference between the first resonant frequency and the second resonant frequency, a difference between the second resonant frequency and the third resonant frequency, and a difference between the first resonant frequency and the third resonant frequency. Specifically, $\Delta fr$ denotes a maximum value out of disagreement quantities among the resonant frequencies of the case-side diaphragm 43a, the ultrasonic element 50, and the closed space SC. BW denotes a bandwidth of the widest resonance band among the ultrasonic element 50, the closed space SC, and the case-side diaphragm 43a.

The "resonance band" pertains to a frequency band between two frequencies fa and fb which are 3 dB lower than a peak value on an output curve or characteristic curve exhibiting a resonant frequency as a peak. "Being 3 dB lower than a peak value" may read as being "$1/\sqrt{2}$ times larger than a peak value". The "resonance band" may be referred to as a "resonance band for structural resonance" or a "3 dB band of a resonance peak". The bandwidth may be referred to as a "−3 dB bandwidth", "3 dB bandwidth", or simply, "frequency bandwidth".

Advantageous Effects

Referring to the drawings, an overview of operations by the constitution of the present embodiment will be described in conjunction with advantageous effects exerted by the constitution.

When the ultrasonic sensor 1 is on the onboard state, the bare surface 3b that is the external surface of the outside baseplate 43 of the element storage case 4 is exposed to the external space SD. Therefore, when the vehicle V is traveling, a hard foreign matter such as a pebble may collide with the bare surface 3b.

In the above constitution, the ultrasonic element 50 is stored in the element storage case 4, and dissociated from the case-side diaphragm 43a included in the element storage case 4. Specifically, the ultrasonic element 50 is not bonded to the outside baseplate 43 which is exposed to the external space SD in the onboard state. Therefore, even when a hard foreign matter such as a pebble collides with the case-side diaphragm 43a, an impact stemming from the collision does not directly act on the ultrasonic element 50. Therefore, occurrence of a crack in the ultrasonic element 50 is satisfactorily prevented. In particular, even when the outside baseplate 43 is not made thick, occurrence of a disadvantage such as a crack in the ultrasonic element 50 can be successfully avoided. This makes it possible to avoid an increase in the size of the physical constitution of the ultrasonic sensor 1, and satisfactorily protect the ultrasonic element 50.

The distal end in the directional-axis direction of the ultrasonic microphone 3, that is, the distal side in the directional-axis direction of the lateral plate 41 is liquid-tightly blocked by the outside baseplate 43. Therefore, entry of a liquid such as water into the element storage case 4 from the side of the bare surface 3b, that is, external space SD is successfully inhibited.

Further, the proximal end in the directional-axis direction of the ultrasonic microphone 3 is liquid-tightly shielded by the sensor case 2 and sleeve member in the assembled state. More specifically, the case lateral space SS and a case back space SB are occupied by the microphone storage 2c and sleeve member. Therefore, entry of a liquid such as water into the element storage case 4 from the side of the body interior space SN is successfully inhibited.

As mentioned above, according to the above constitution, the ultrasonic element 50 and closed space SC are satisfactorily protected from entry of water or the like. Therefore, occurrence of a disadvantage stemming from entry of water or the like, such as, a failure of the ultrasonic element 50 or a fluctuation in the resonant frequency of the closed space SC can be successfully inhibited.

The element-side diaphragm 54 included in the ultrasonic element 50 is opposed to the case-side diaphragm 43a with the closed space SC between the element-side diaphragm and closed space. In other words, the closed space SC that is a resonant space is interposed between the element-side diaphragm 54 that is a thin part of the semiconductor substrate 51 and the case-side diaphragm 43a that is a thin part of the outside baseplate 43. The closed space SC is formed as a liquid-tight and airtight space. Therefore, an ultrasonic vibration successfully propagates between the element-side diaphragm 54, that is, ultrasonic element 50 and the case-side diaphragm 43a via a medium (for example, air) in the closed space SC.

More specifically, when a probe wave is transmitted, an ultrasonic vibration generated by the ultrasonic element 50 in response to application of a drive voltage propagates to a medium in the closed space SC. The ultrasonic vibration having propagated to the medium in the closed space SC propagates to the case-side diaphragm 43a. The ultrasonic vibration having propagated to the case-side diaphragm 43a causes the probe wave to be transmitted to the external space SD. In contrast, when the probe wave is received, the vibration of the case-side diaphragm 43a excited with the wave received from the external space SD propagates to the medium in the closed space SC. The vibration having propagated to the medium in the closed space SC propagates to the element-side diaphragm 54. Accordingly, an output voltage is generated by the element part 55.

As mentioned above, an ultrasonic vibration of one of the ultrasonic element 50 and case-side diaphragm 43a propagates to the other one owing to linkage resonance made via a medium in the gap G. Therefore, the efficiency in propagating an ultrasonic wave between the ultrasonic element 50 and case-side diaphragm 43a improves.

The ultrasonic sensor 1 is designed so that the first resonant frequency, second resonant frequency, and third resonant frequency agree with one another. The first resonant frequency is the resonant frequency, that is, structural resonant frequency of the ultrasonic element 50. The second resonant frequency is the resonant frequency, that is, sympathetic resonance frequency of the closed space SC. The third resonant frequency is the resonant frequency, that is, structural resonant frequency of the case-side diaphragm 43a. Accordingly, the efficiency in propagating an ultrasonic vibration between the ultrasonic element 50 and case-side diaphragm 43a improves.

As mentioned above, according to the above constitution, the ultrasonic element 50 can be successfully protected, and propagation of an ultrasonic vibration between the external space SD of the ultrasonic sensor 1 and the ultrasonic element 50 can be satisfactorily realized. In particular, even when a MEMS type constitution that is not expected to provide as a large output as a bulk type does is adopted as the ultrasonic element 50, a vibration efficiently propagates owing to linkage resonance. Therefore, excellent transmitting/receiving performance can be realized. As for the ultrasonic sensor 1 for an onboard use, even when the outside baseplate 43 is formed to have a thickness of 0.5 mm or more for the purpose of ensuring the intensity of the element storage case 4, the excellent transmitting/receiving performance can be realized.

In terms of manufacture, it is hard to fully agree the first resonant frequency, second resonant frequency, and third resonant frequency with one another. In order to substantially agree the first resonant frequency, second resonant frequency, and third resonant frequency with one another, to what extent the differences are permitted is a problem to be overcome.

As a result of in-depth examination, associate inventors including a lead inventor of the present invention have found a condition under which the first resonant frequency, second resonant frequency, and third resonant frequency can be evaluated to substantially agree with one another. The condition is $\Delta fr \leq sBW$, where $\Delta fr$ denotes a maximum value among a difference between the first resonant frequency and the second resonant frequency, a difference between the second resonant frequency and the third resonant frequency, and a difference between the first resonant frequency and the third resonant frequency, and BW denotes a bandwidth of the widest resonance band among the ultrasonic element 50, the closed space SC, and the case-side diaphragm 43a. Accordingly, excellent transmitting/receiving characteristics are obtainable.

In the above constitution, the element storage case 4 is formed to seal the closed space SC airtightly and liquid-tightly. Therefore, a medium (for example, air) in the closed space SC interposed between the case-side diaphragm 43a and the ultrasonic element 50 satisfactorily serves as a liquid spring that propagates an ultrasonic vibration. Specifically, since the closed space SC is airtightly formed, the intensity of a compressional wave between the ultrasonic element 50 and case-side diaphragm 43a can be enhanced. Therefore, according to the foregoing constitution, excellent transmitting/receiving characteristics are obtainable.

The directivity of the ultrasonic microphone 3 varies depending on a drive frequency and a vibrational range of the case-side diaphragm 43a. In other words, a directional angle gets larger as a product between the drive frequency and vibrational range gets smaller.

In the above constitution, the element-side hollow part 58 that is the space inside the element-side recessed part 57, the gap G, and the communication hole 63 constitute the closed space SC. The spatial sectional area of the closed space SC varies in the directional-axis direction. More specifically, the spatial sectional area of the element-side hollow part 58 is smallest, and the spatial sectional area of the gap G is largest. The spatial sectional area of the communication hole 63 is larger than the spatial sectional area of the element-side hollow part 58. Accordingly, the design freedom for realizing a desired drive frequency and directional angle is upgraded.

For example, as far as the drive frequency is concerned, the structural resonant frequency of the ultrasonic element 50 can be set to a desired frequency. The structural resonant frequency of the ultrasonic element 50 can be designated by adjusting design parameters including a dimension of a layered body of the element-side diaphragm 54 and the element part 55. More specifically, for example, the structural resonant frequency of the ultrasonic element 50 can be set to an arbitrary value by adjusting the material, thickness, and size in the in-plane direction of the element-side diaphragm 54.

The directional angle and structural resonant frequency of the case-side diaphragm 43a can be designated by adjusting design parameters including a dimension of the case-side diaphragm 43a. More specifically, for example, the material, thickness, and size in the in-plane direction of the case-side diaphragm 43a can be adjusted. Specifically, in the above constitution, the directional angle and the structural resonant frequency of the case-side diaphragm 43a can be adjusted independently of the resonant frequencies of the ultrasonic element 50 and closed space SC respectively.

Further, the resonant frequency of the closed space SC can be designated by adjusting dimensions of parts constituting the closed space SC. More specifically, for example, the directional-axis direction dimensions and in-plane direction dimensions of the gap G, the communication hole 63, and the element-side hollow part 58 can be adjusted. Herein, for designation of the resonant frequency, efforts should be preferably made not to vary the thicknesses and sizes in the in-plane direction of the case-side diaphragm 43a and the element-side diaphragm 54 respectively. More specifically, for example, the thickness of the case-side thick part 43b, the thickness of the semiconductor substrate 51, the thickness of the support substrate 6, and the inner diameter of the communication hole 63 should preferably be adjusted. Accordingly, the resonant frequency can be adjusted independently of the structural resonant frequencies of the element-side diaphragm 54 and the ultrasonic element 50 respectively.

In the above constitution, the ultrasonic element 50 is formed as a MEMS type semiconductor element on the semiconductor substrate 51. According to the constitution, while the transmitting/receiving performance of the ultrasonic element 50 is sustained, the ultrasonic element 50 can be satisfactorily downsized. Therefore, plural ultrasonic elements 50 can be arrayed in the in-plane direction as described later in relation to other embodiments in order to sophisticate the ultrasonic sensor 1 without an increase in the size of the physical constitution of the ultrasonic sensor 1.

In the above constitution, the element storage case 4 includes the lateral plate 41 shaped like a cylinder encircling the directional axis DA, and the outside baseplate 43 that liquid-tightly blocks one end side of the lateral plate 41. The case-side diaphragm 43a is formed as a thin part in the center of the outside baseplate 43 in the in-plane direction. Further, the semiconductor substrate 51 including the ultrasonic element 50 is fixedly supported by the case-side thick part 43b that is a thick part of the outside baseplate 43 formed in the perimeter of the case-side diaphragm 43a. According to the constitution, the closed space SC that is a resonant space interposed between the case-side diaphragm 43a and the element-side diaphragm 54 can be formed to exhibit a desired property according to a simple manufacturing process.

Second Embodiment

Figure 4:
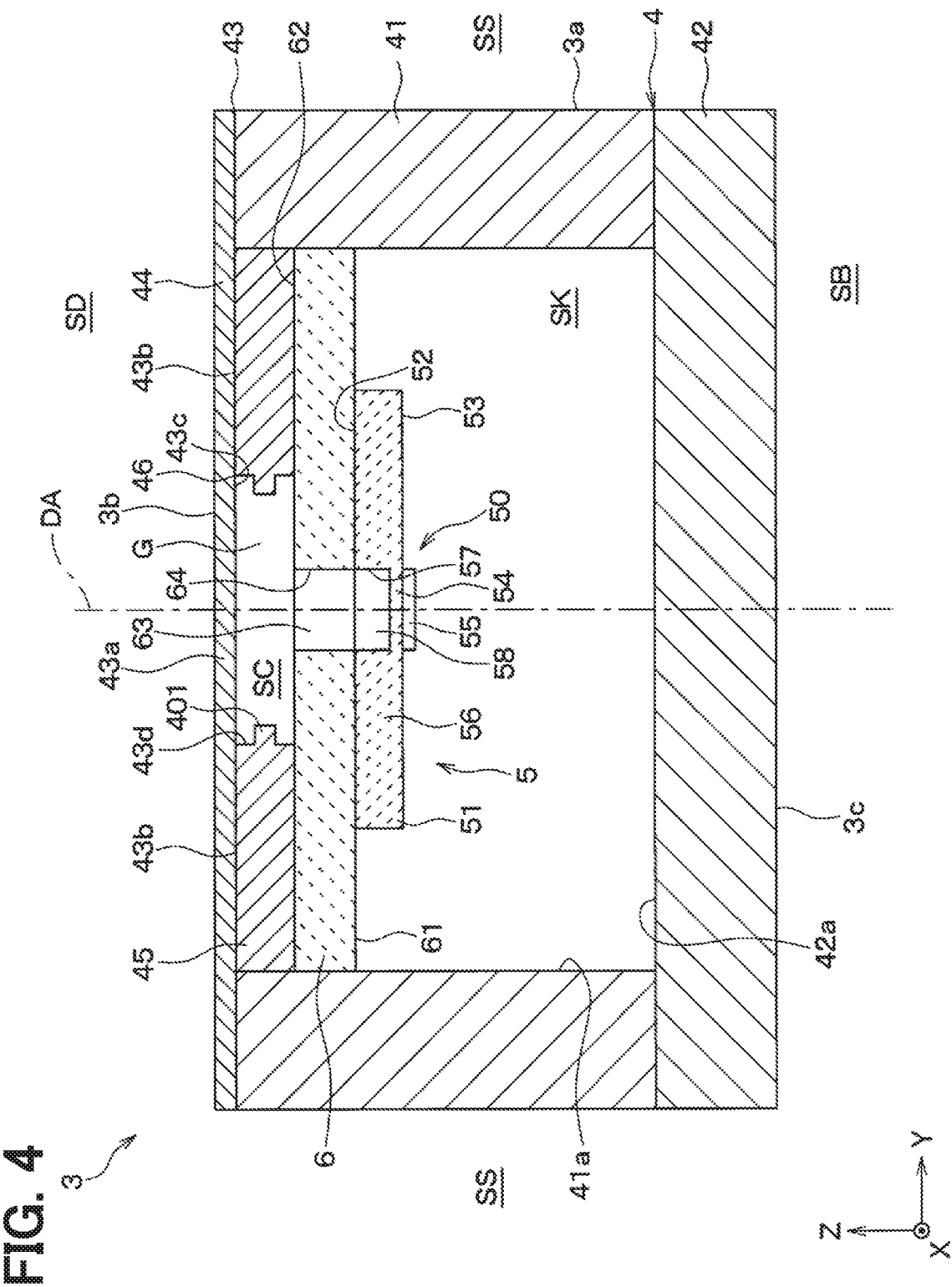
FIG. 4 is a sectional view showing an outline constitution of an ultrasonic microphone according to a second embodiment.

Referring to FIG. 4, a second embodiment will be described below. Parts of the second embodiment different from those of the first embodiment will be mainly described below. The same signs are assigned to parts that are identical to or homogeneous to each other between the first embodiment and the second embodiment. Therefore, unless a technological discrepancy is found or an additional explanation is exceptional, explanations concerning the first embodiment are adapted to the constituent elements of the second embodiment bearing the same signs as those of the first embodiment do.

As shown in FIG. 4, the ultrasonic microphone 3 includes a volume adjustment part 401. The volume adjustment part 401 faces the closed space SC at a position different from that of the diaphragm back 43c.

In the present embodiment, the volume adjustment part 401 is formed as a projection jutting out to the closed space SC in the in-plane direction, that is, radial direction. More specifically, in the example shown in FIG. 4, the volume adjustment part 401 that is a projection is included in the gap inner wall surface 43d.

Since the volume adjustment part 401 that is a projection jutting out to the closed space SC is included to regulate the volume of the closed space SC, the resonant frequency of the closed space SC can be adjusted. The volume adjustment part 401 may be included in the diaphragm back 43c. However, the diaphragm back 43c is an internal surface of the case-side diaphragm 43a facing the closed space SC. When the projection is included in the diaphragm back 43c, the projection becomes equivalent to an object adhering to the case-side diaphragm 43a from a vibrational viewpoint. Therefore, when the volume adjustment part 401 is included in the diaphragm back 43c, not only the resonant frequency of the closed space SC but also the resonant frequency of the case-side diaphragm 43a vary.

In the present embodiment, the volume adjustment part 401 that adjusts the volume of the closed space SC is therefore located at a position different from that of the diaphragm back 43c. According to the constitution, the resonant frequency of the closed space SC can be adjusted using the volume adjustment part 401 independently of the structural resonant frequencies of the element-side diaphragm 54 and the ultrasonic element 50 respectively. Therefore, the design freedom for realizing a desired drive frequency and directional angle improves.

The volume adjustment part 401 that is a projection may be included in the communication hole 63 in place of or in addition to the gap inner wall surface 43d. Likewise, the volume adjustment part 401 that is a projection may be included in any cylindrical internal surface-like part of the element-side recessed part 57 other than the back of the element-side diaphragm 54.

Third Embodiment

Figure 5:
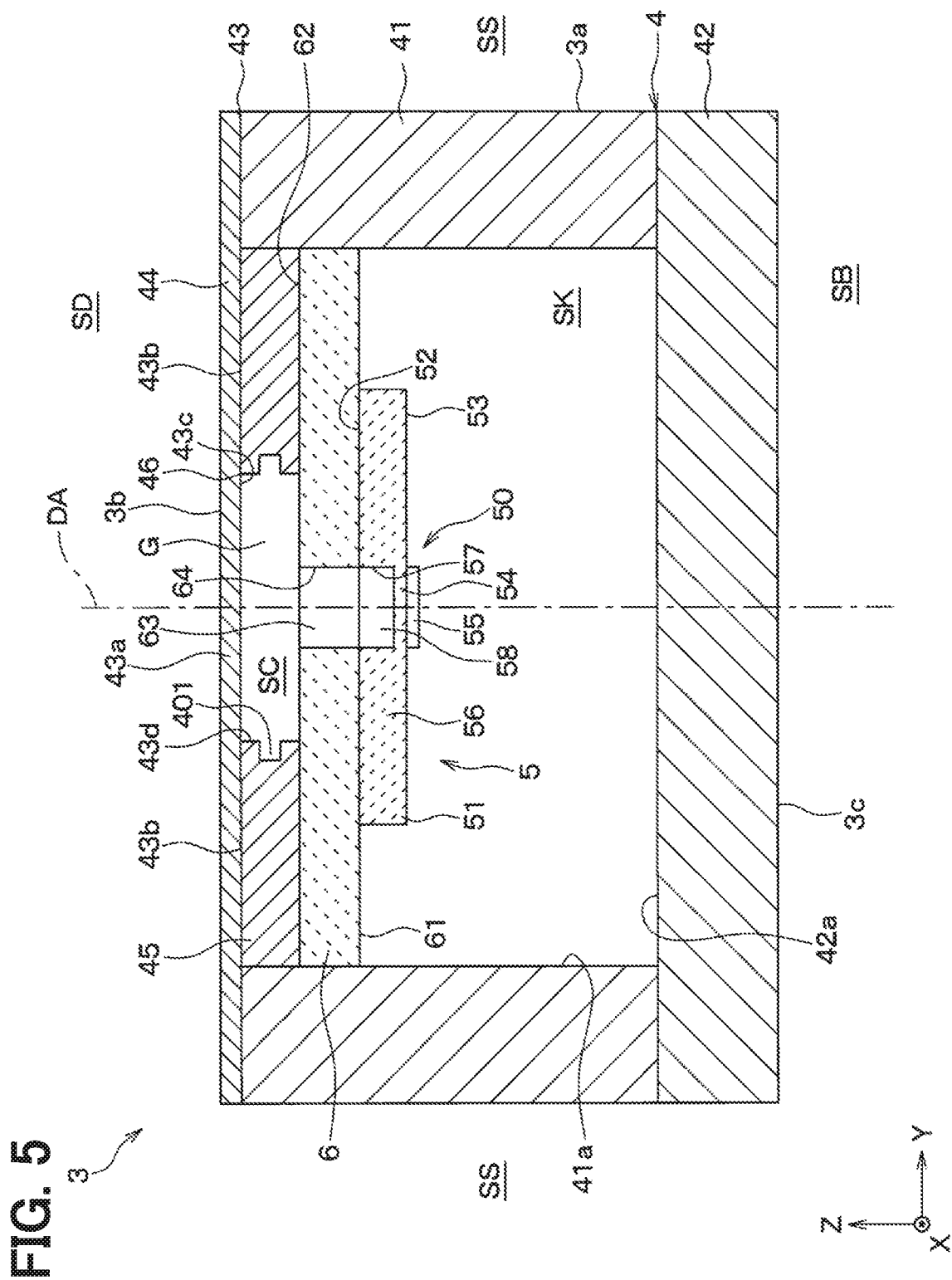
FIG. 5 is a sectional view showing an outline constitution of an ultrasonic microphone according to a third embodiment.

Referring to FIG. 5, a third embodiment will be described blow. Parts of the third embodiment different from those of the second embodiment will be mainly described below. The same signs are assigned to parts which are identical to or homogeneous to each other between the second embodiment and the third embodiment. Therefore, unless a technological discrepancy is found or an additional explanation is exceptional, explanations concerning the above other embodiments are adapted to the constituent elements of the third embodiment bearing the same signs as those of the other embodiments. The same applies to a fourth embodiment and subsequent embodiments to be described later.

As shown in FIG. 5, in the present embodiment, the volume adjustment part 401 is formed as a recessed part that opens on the closed space SC. More specifically, in the example shown in FIG. 5, the volume adjustment part 401 that is a recessed part opens on the gap inner wall surface 43d in the in-plane direction, that is, radial direction.

According to the foregoing constitution, the same advantageous effects as those of the second embodiment can be exerted. The volume adjustment part 401 that is a recessed part may be included in the communication hole 63 in place of or in addition to the gap inner wall surface 43d. Likewise, the volume adjustment part 401 that is a recessed part may be included in any cylindrical internal surface-like part of the element-side recessed part 57 other than the back of the element-side diaphragm 54.

Fourth Embodiment

Figure 6:
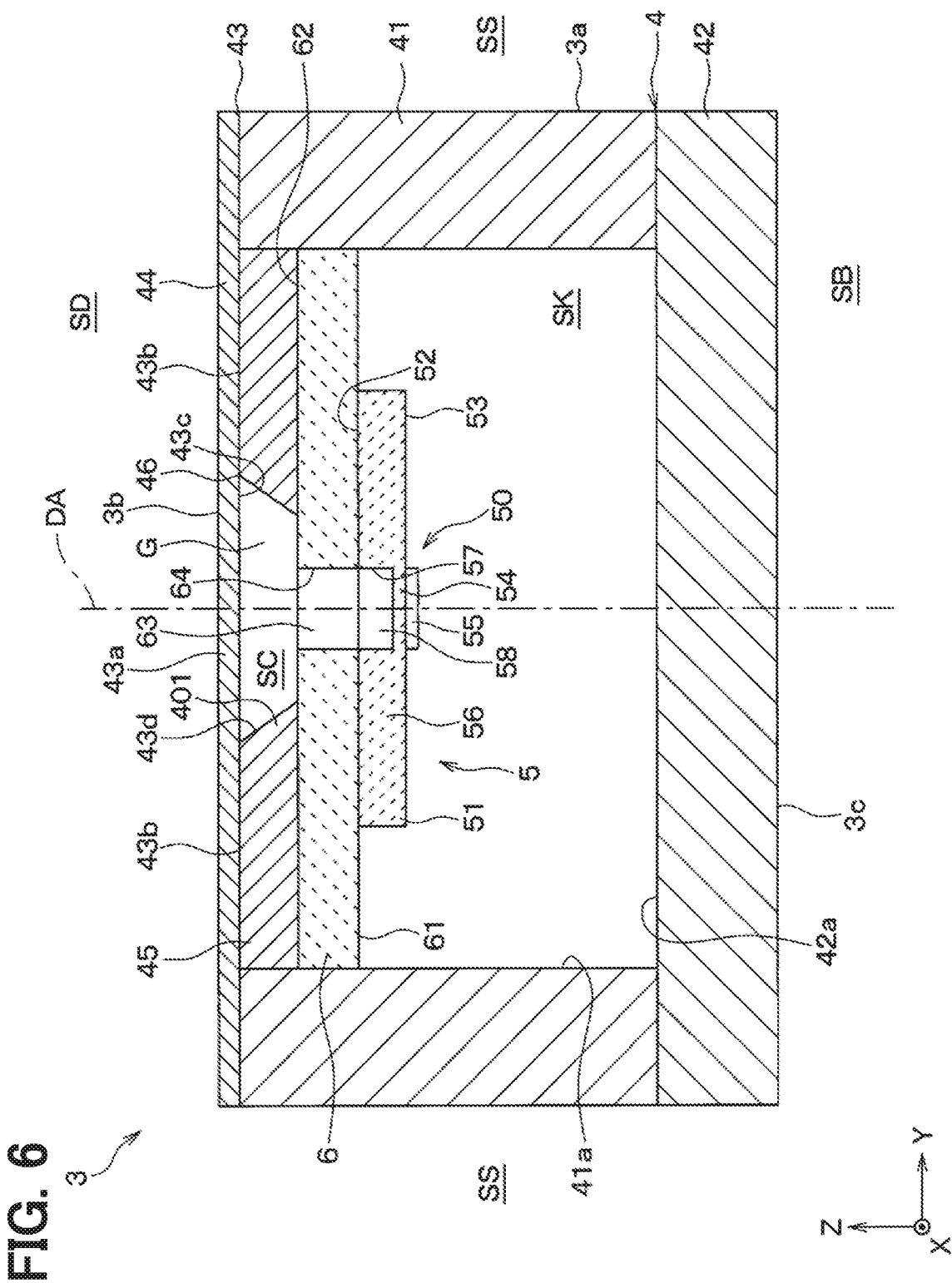
FIG. 6 is a sectional view showing an outline constitution of an ultrasonic microphone according to a fourth embodiment.

Referring to FIG. 6, a fourth embodiment will be described below. In the present embodiment, the volume adjustment part 401 is a tapered part of the outside baseplate 43, and the inner diameter of the gap formation hole 46 varies depending on a position in the directional-axis direction. Specifically, the gap inner wall surface 43d is an inner wall surface of the gap formation hole 46 shaped like a truncated cone, and is shaped like a tapered surface.

According to the forgoing constitution, the same advantageous effects as those of the second and third embodiments can be exerted. The volume adjustment part 401 that is a tapered part may be included in the communication hole 63 in place of or in addition to the gap formation hole 46 included in the outside baseplate 43. Likewise, the volume adjustment part 401 that is a tapered part may be included in the element-side recessed part 57.

Fifth Embodiment

Figure 7:
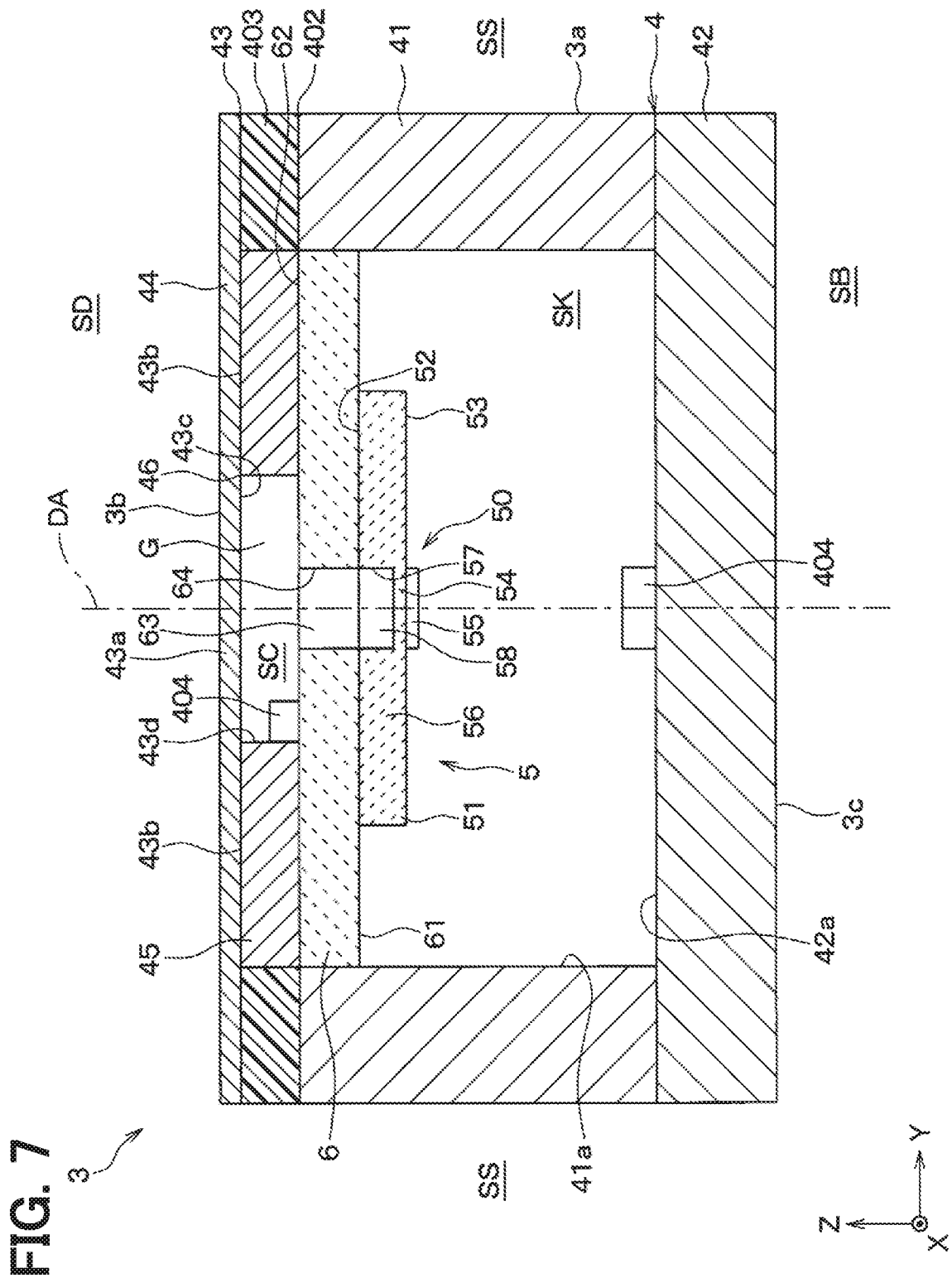
FIG. 7 is a sectional view showing an outline constitution of an ultrasonic microphone according to a fifth embodiment.

Referring to FIG. 7, a fifth embodiment will be described below. In the present embodiment, a slit 402 is formed in the element storage case 4. The slit 402 is formed at the distal end in the directional-axis direction of the element storage case 4, that is, an end on a side having the case-side diaphragm 43a.

As shown in FIG. 7, in the present embodiment, the slit 402 is formed at an upper end of the lateral plate 41. More specifically, the slit 402 pierces the lateral plate 41 in the radial direction so as to reach the case-side thick part 43b of the outside baseplate 43.

The slit 402 is airtightly and liquid-tightly sealed by a sealant 403. The sealant 403 is made of, for example, a synthetic resin. A moisture absorbent 404 is stored in the element storage case 4. The moisture absorbent 404 is incorporated in the closed space SC. Further, the moisture absorbent 404 is incorporated in the substrate back space SK.

According to the foregoing constitution, the inclusion of the slit 402 facilitates vibration of the case-side diaphragm 43a. Accordingly, the directivity of the ultrasonic sensor 1 can be enhanced. Further, since the slit 402 is airtightly and liquid-tightly sealed by the sealant 403, entry of a liquid such as water into the element storage case 4 from the side of the bare surface 3b, that is, external space SD can be successfully inhibited. Further, the airtightness of the closed space SC can be satisfactorily ensured.

Since the moisture absorbent 404 is incorporated in the closed space SC, a fluctuation in the resonant frequency of the closed space SC can be successfully suppressed. Further, since the moisture absorbent 404 is incorporated in the substrate back space SK, deterioration or occurrence of a failure in the ultrasonic element 50, such as, corrosion of a wiring can be satisfactorily inhibited.

Sixth Embodiment

Figure 8:
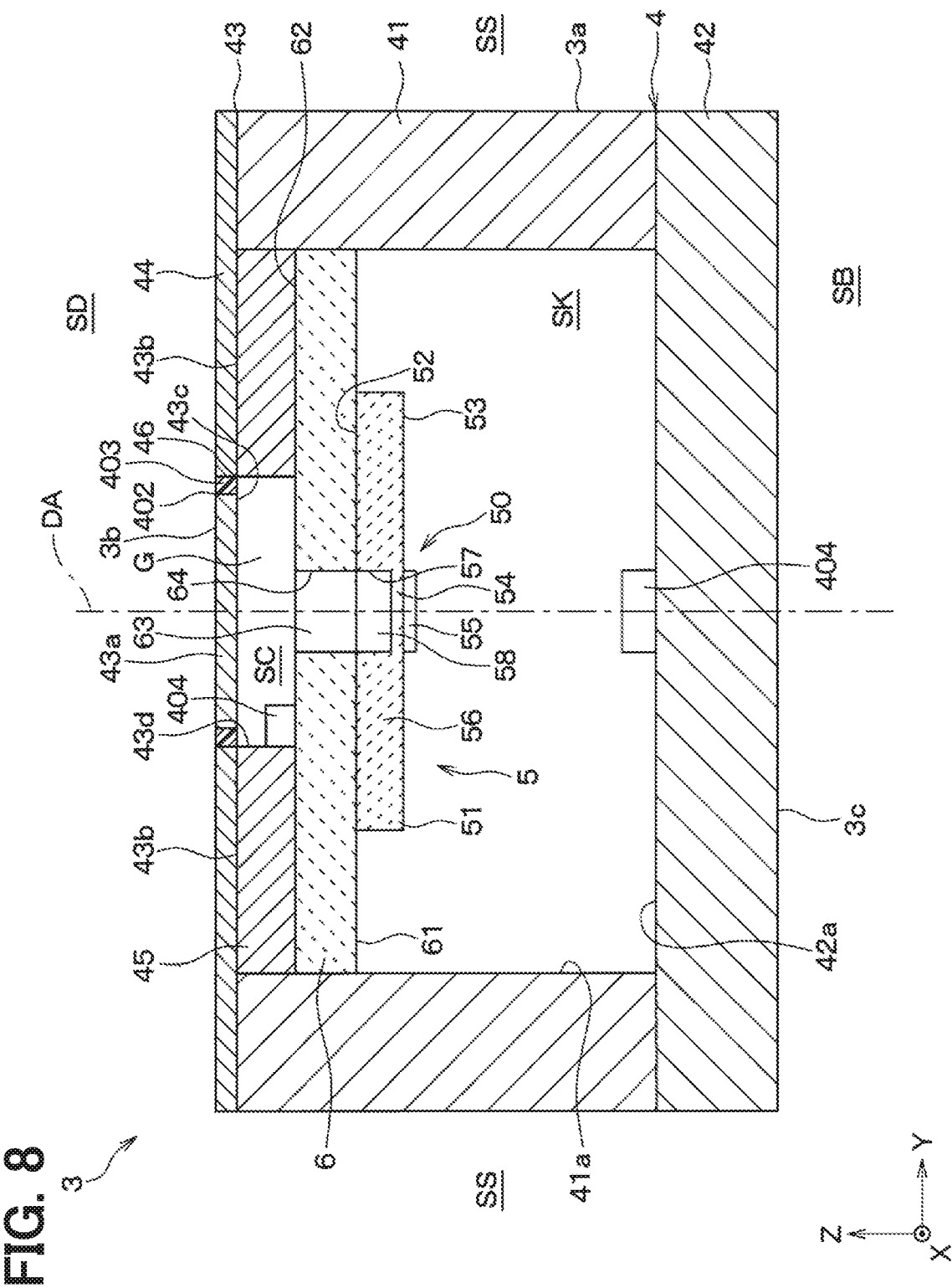
FIG. 8 is a sectional view showing an outline constitution of an ultrasonic microphone according to a sixth embodiment.

Referring to FIG. 8, a sixth embodiment will be described below. In the present embodiment, the slit 402 is formed in the case-side diaphragm 43a. More specifically, in the example shown in FIG. 8, the slit 402 pierces the case-side diaphragm 43a in the thickness direction. Further, the slit 402 is formed on an edge in the radial direction of the case-side diaphragm 43a.

According to the foregoing constitution, the same advantageous effects as those of the fifth embodiment can be exerted. Even in the present embodiment, similarly to the fifth embodiment, since the moisture absorbent 404 is incorporated in the closed space SC, a fluctuation in the resonant frequency of the closed space SC can be satisfactorily suppressed. Further, since the moisture absorbent 404 is incorporated in the substrate back space SK, deterioration or occurrence of a failure in the ultrasonic element 50 can be successfully inhibited.

Seventh Embodiment

Figure 9:
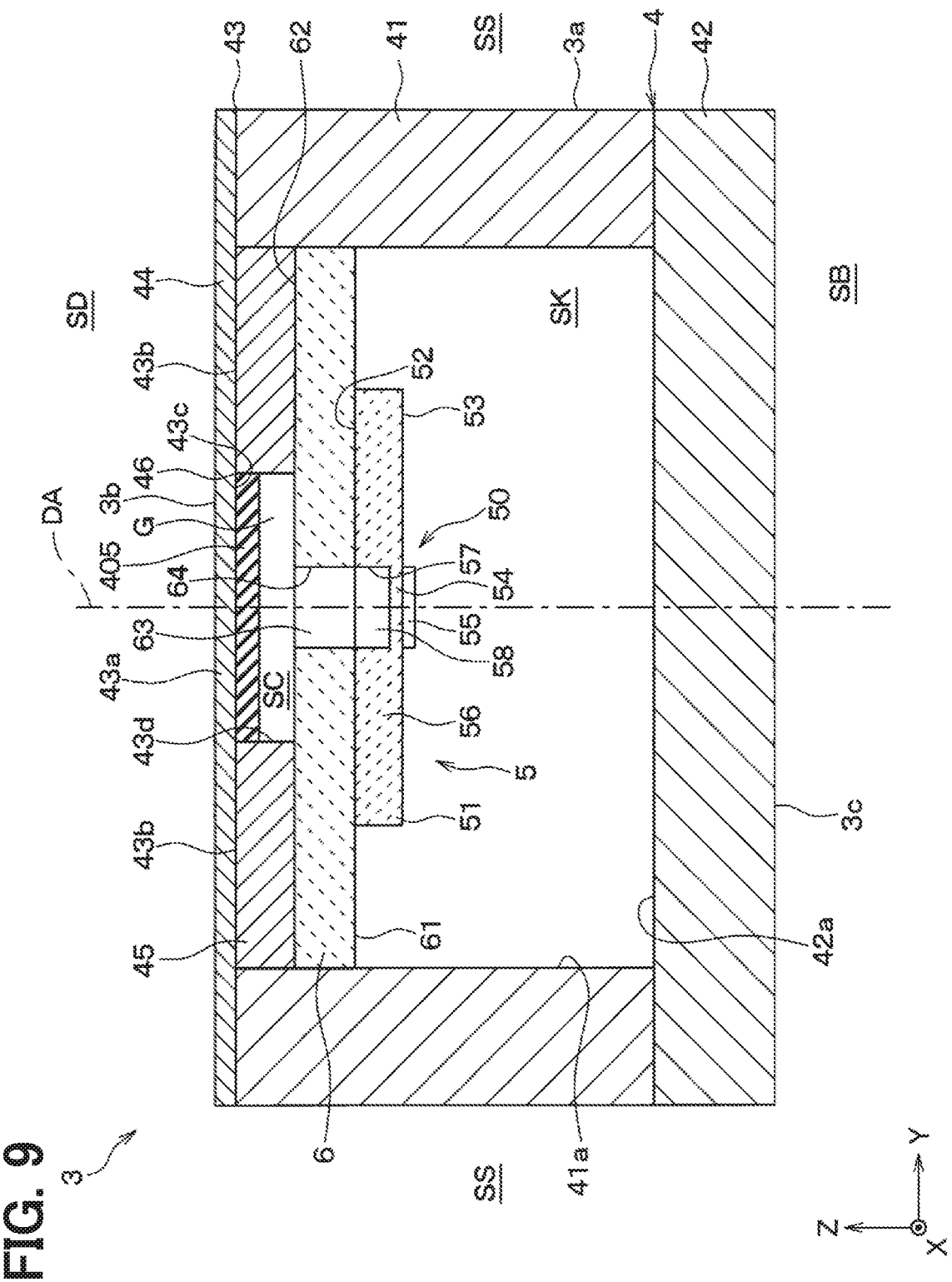
FIG. 9 is a sectional view showing an outline constitution of an ultrasonic microphone according to a seventh embodiment.

Referring to FIG. 9, a seventh embodiment will be described below. In the present embodiment, a damper 405 is stored in the closed space SC, The damper 405 is included to exert a damping effect against a vibration of the case-side diaphragm 43a. More specifically, in the example shown in FIG. 9, the damper 405 is a plate-like member made of a synthetic resin such as a synthetic rubber, and is bonded to the diaphragm back 43c.

According to the foregoing constitution, occurrence of reverberation in the ultrasonic sensor 1 can be satisfactorily minimized. Accordingly, a reverberation time is shortened, and the near-distance detection performance of the ultrasonic sensor 1 is upgraded.

Eighth Embodiment

Figure 10:
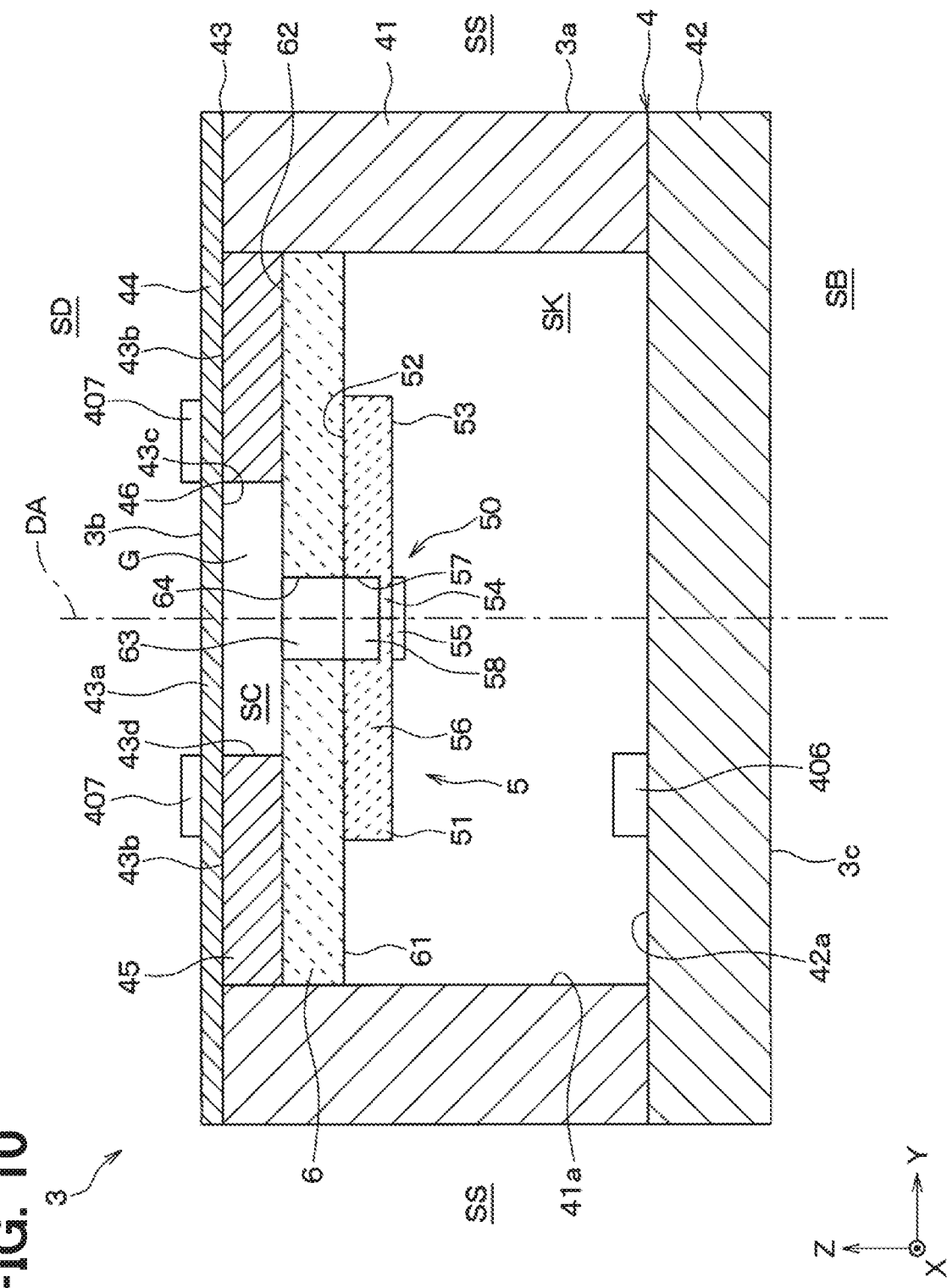
FIG. 10 is a sectional view showing an outline constitution of an ultrasonic microphone according to an eighth embodiment.

Referring to FIG. 10, an eighth embodiment will be described below. In the present embodiment, the ultrasonic microphone 3 includes a temperature sensor 406 and a frequency changer 407.

The temperature sensor 406 generates an output associated with an operational environment temperature of the ultrasonic sensor 1. In the example shown in FIG. 10, the temperature sensor 406 is stored in the substrate back space SK. Specifically, the temperature sensor 406 generates an output associated with the temperature in the substrate back space SK inside the element storage case 4, that is, a space opposed to the element part 55 of the ultrasonic element 50. More specifically, the temperature sensor 406 is secured to the top of the inside bottom 42a of the inside baseplate 42.

The frequency changer 407 changes the vibrational frequency of the case-side diaphragm 43a according to the operational environment temperature of the ultrasonic sensor 1. More specifically, the frequency changer 407 changes the structural resonant frequency of the case-side diaphragm 43a on the basis of an output of the temperature sensor 406. The operation of the frequency changer 407 is controlled by a control IC mounted on a control circuit board that is not shown and stored inside the case main unit 2a shown in FIG. 2.

In the present embodiment, the frequency changer 407 is a piezoelectric element made of a bulk piezoelectric ceramic such as a bulk PZT, and generates distortion when subjected to voltage application. PZT is an abbreviation of Lead Zirconate Titanate. Specifically, the frequency changer 407 is boded to the case-side diaphragm 43a included in the element storage case 4 or a nearby position in order to adjust an internal stress, that is, tension of the case-side diaphragm 43a by means of distortion stemming from voltage application. In the example shown in FIG. 10, the frequency changer 407 is secured to the bare surface 3b at or near the case-side diaphragm 43a included in the outside baseplate 43.

When the operational environment temperature of the ultrasonic sensor 1 varies, the resonant frequency of the case-side diaphragm 43a shifts. When the resonant frequency of the case-side diaphragm 43a shifts, a difference between the resonant frequency of the case-side diaphragm 43a and the resonant frequency of the ultrasonic element 50 gets larger. Accordingly, the efficiency in propagating a vibration between the ultrasonic element 50 and the case-side diaphragm 43a is degraded. In the present embodiment, the temperature sensor 406 and the frequency changer 407 are therefore included.

According to the foregoing constitution, the temperature sensor 406 generates an output associated with the operational environment temperature of the ultrasonic sensor 1. Accordingly, the operational environment temperature of the ultrasonic sensor 1 can be detected. The frequency changer 407 changes the resonant frequency of the case-side diaphragm 43a according to the detected operational environment temperature. More specifically, a control voltage is applied to the frequency changer 407 according to the detected operational environment temperature. The frequency changer 407 generates distortion according to the applied control voltage, and thus adjusts an internal stress, that is, tension of the case-side diaphragm 43a.

According to the foregoing constitution, a disagreement of a resonant condition derived from a change in the operational environment temperature can be satisfactorily compensated. Further, the resonant frequency of the case-side diaphragm 43a can be controlled independently of the resonant frequency of the closed space SC and the resonant frequency of the ultrasonic element 50.

Ninth Embodiment

Figure 11:
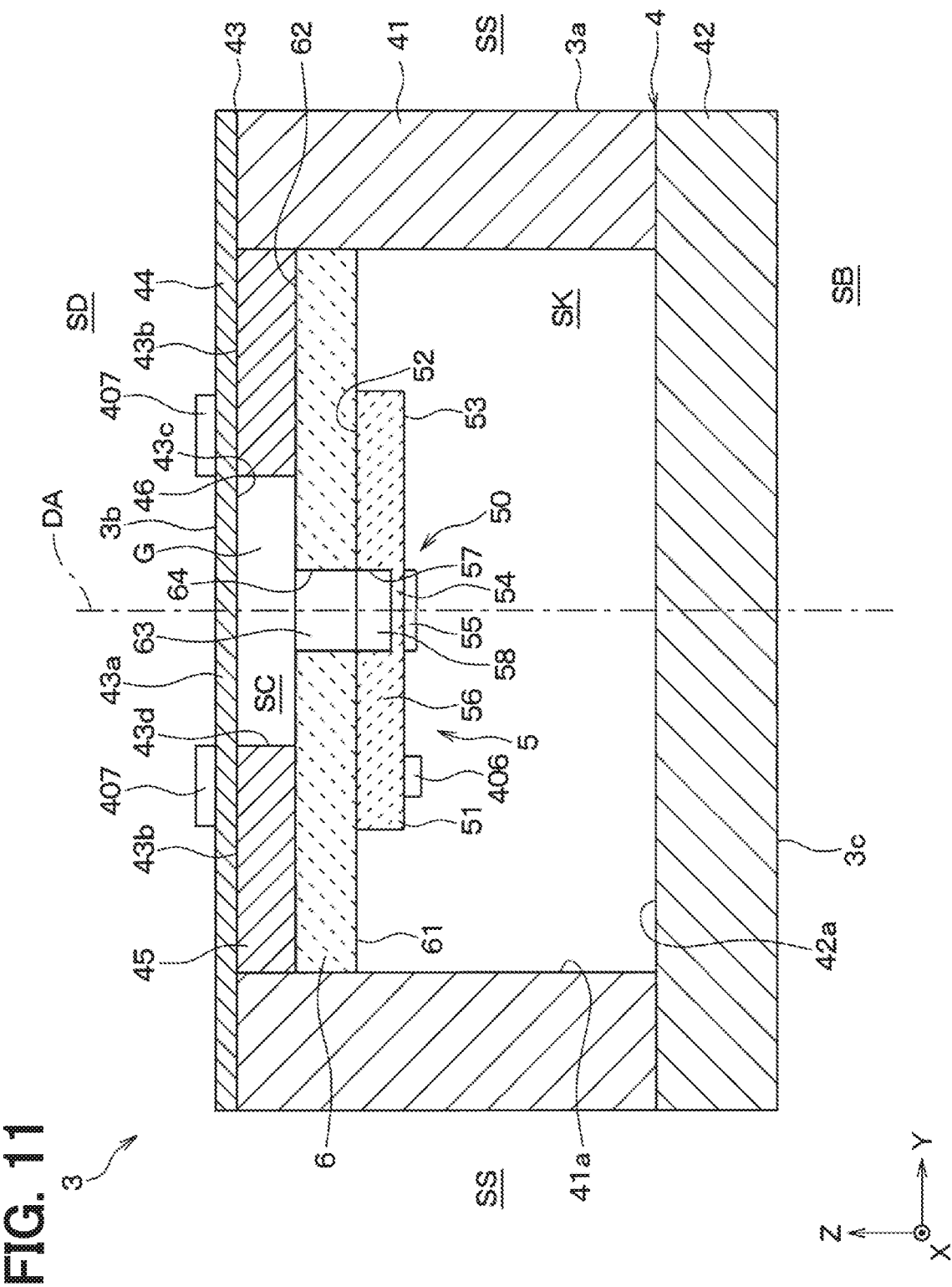
FIG. 11 is a sectional view showing an outline constitution of an ultrasonic microphone according to a ninth embodiment.

Referring to FIG. 11, a ninth embodiment will be described below. In the present embodiment, the temperature sensor 406 is included in the semiconductor substrate 51. More specifically, in the example shown in FIG. 11, the temperature sensor 406 is secured to the element support surface 53.

According to the foregoing constitution, the same advantageous effects as those of the eighth embodiment can be exerted. When the temperature sensor 406 is included in the semiconductor substrate 51, a placement position of the temperature sensor 406 is not limited to the one on the element support surface 53. For example, the temperature sensor 406 may be included in an end surface of the semiconductor substrate 51. Otherwise, the temperature sensor 406 may be incorporated in the semiconductor substrate 51. Further, the temperature sensor 406 may be included in the semiconductor substrate 51 according to a MEMS technology.

Tenth Embodiment

Figure 12:
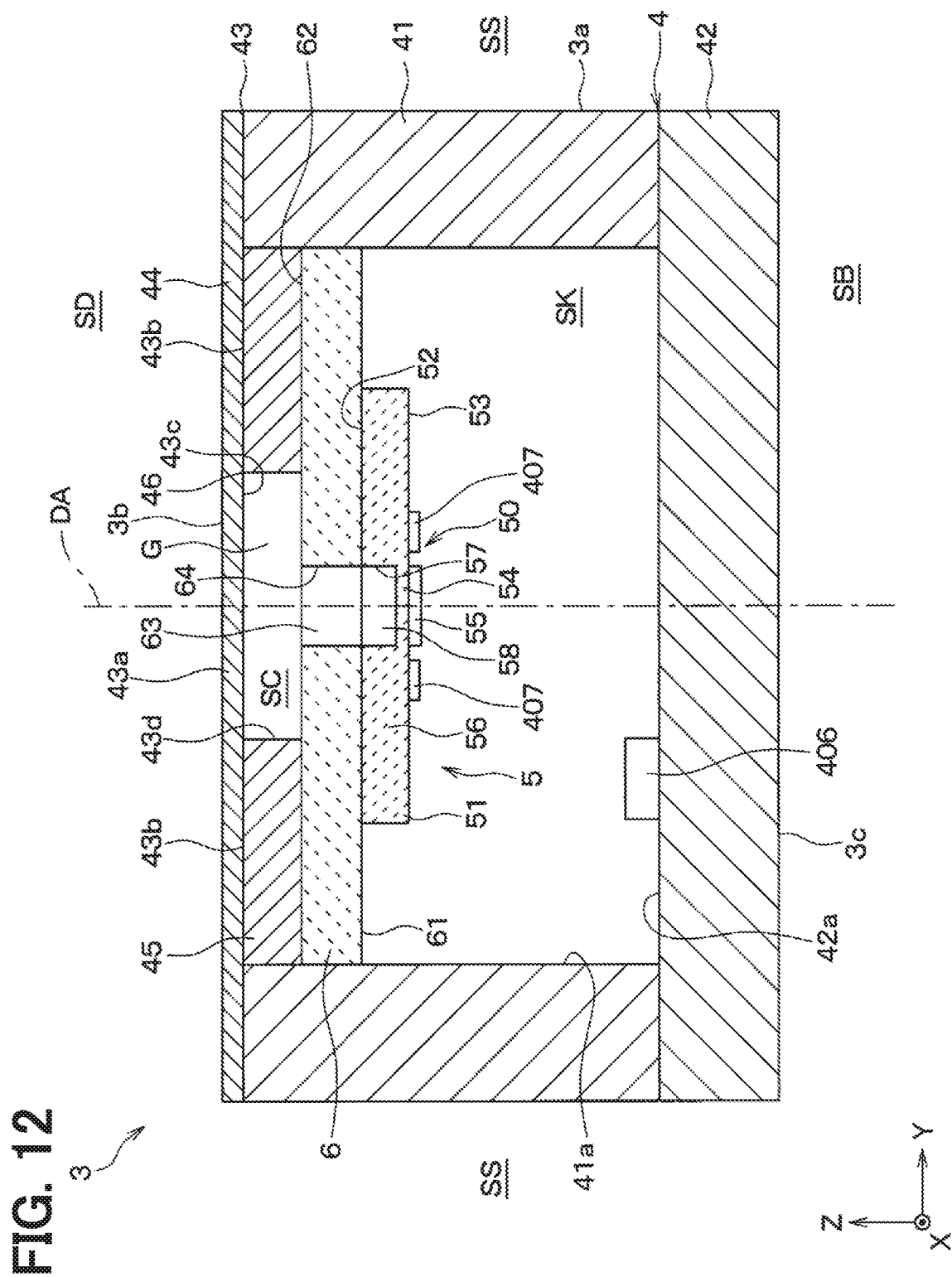
FIG. 12 is a sectional view showing an outline constitution of an ultrasonic microphone according to a tenth embodiment.

Referring to FIG. 12, a tenth embodiment will be described below. In the present embodiment, the frequency changer 407 changes the vibrational frequency of the ultrasonic element 50. More specifically, the frequency changer 407 changes the structural resonant frequency of the ultrasonic element 50 on the basis of an output of the temperature sensor 406.

In the present embodiment, the frequency changer 407 is a MEMS type piezoelectric element, and generates distortion when subjected to voltage application. Specifically, the frequency changer 407 is located at the element-side diaphragm 54 included in the semiconductor substrate 51 or a nearby position in order to adjust the internal stress, that is, tension of the element-side diaphragm 54 by means of distortion stemming from voltage application.

When the operational environment temperature of the ultrasonic sensor 1 varies, the resonant frequency of the case-side diaphragm 43a shifts. When the resonant frequency of the case-side diaphragm 43a shifts, the efficiency in propagating a vibration between the ultrasonic element 50 and the case-side diaphragm 43a is degraded. In the present embodiment, the temperature sensor 406 and the frequency changer 407 are therefore included.

According to the foregoing constitution, the temperature sensor 406 generates an output associated with the operational environment temperature of the ultrasonic sensor 1. Accordingly, the operational environment temperature of the ultrasonic sensor 1 can be detected. The frequency changer 407 changes the resonant frequency of the ultrasonic element 50 according to the detected operational environment temperature, More specifically, a control voltage is applied to the frequency changer 407 according to the detected operational environment temperature. The frequency changer 407 generates distortion according to the applied control voltage, and thus adjusts the internal stress, that is, tension of the element-side diaphragm 54.

According to the foregoing constitution, a disagreement of a resonant condition derived from a change in the operational environment temperature is satisfactorily compensated. Further, the resonant frequency of the ultrasonic element 50 can be controlled independently of the resonant frequency of the closed space SC and the resonant frequency of the case-side diaphragm 43a.

Eleventh Embodiment

Figure 13:
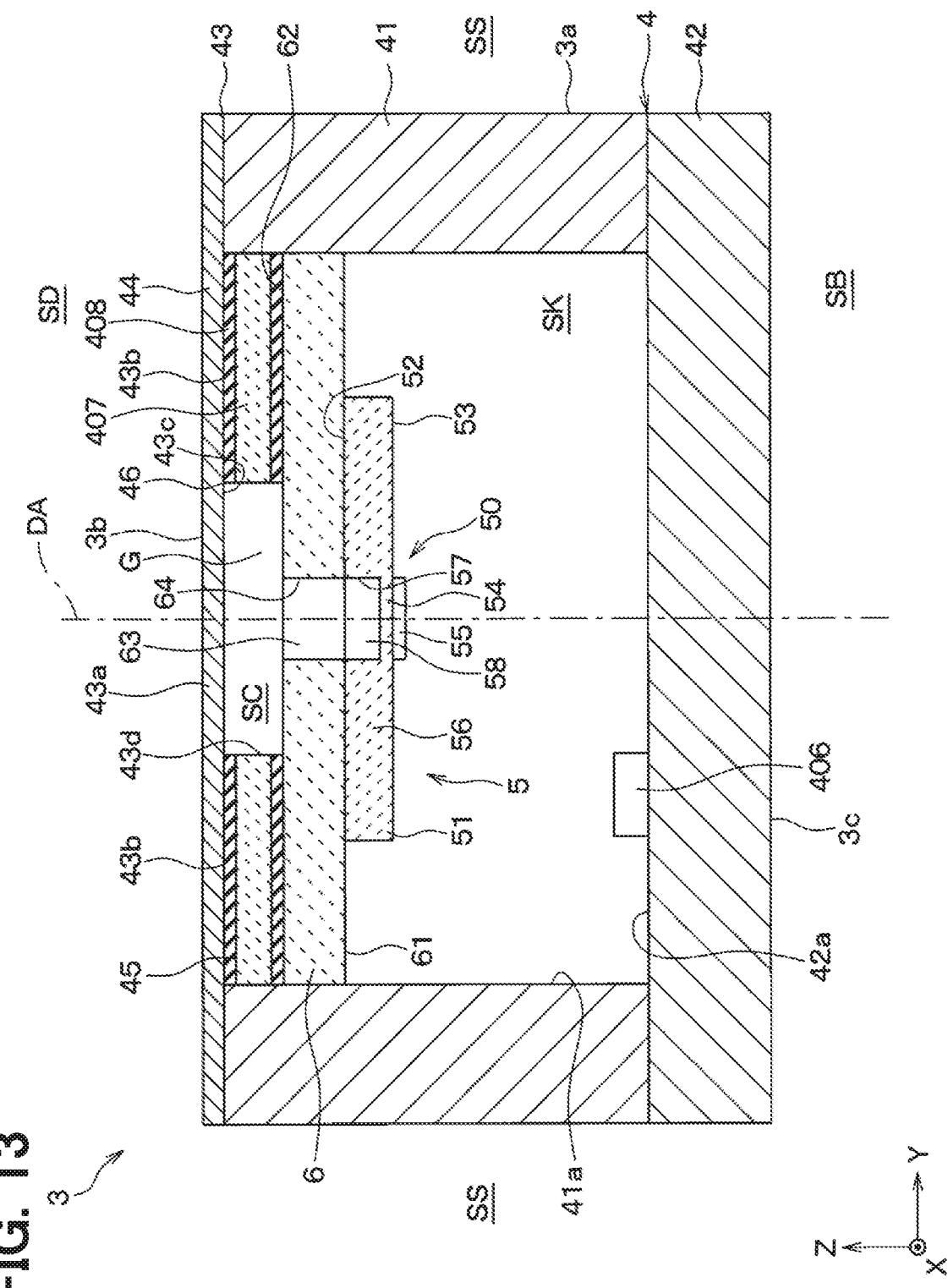
FIG. 13 is a sectional view showing an outline constitution of an ultrasonic microphone according to an eleventh embodiment.

Referring to FIG. 13, an eleventh embodiment will be described below. In the present embodiment, the frequency changer 407 changes the vibrational frequency of the closed space SC. More specifically, the frequency changer 407 changes the resonant frequency of the closed space SC on the basis of an output of the temperature sensor 406.

In the present embodiment, the frequency changer 407 is a piezoelectric element made of a bulk piezoelectric ceramic such as bulk PZT, and deforms when subjected to voltage application. In the example shown in FIG. 13, the frequency changer 407 is included in the case-side thick part 43b. More specifically, the frequency changer 407 is interposed between the diaphragm formation part 44 and the support substrate 6. An elastic bonding layer 408 is interposed between the frequency changer 407 and the diaphragm formation part 44, and between the frequency changer 407 and the support substrate 6. The elastic bonding layer 408 is formed with an elastic adhesive bond layer.

According to the foregoing constitution, the temperature sensor 406 generates an output associated with the operational environment temperature of the ultrasonic sensor 1. Accordingly, the operational environment temperature of the ultrasonic sensor 1 can be detected. The frequency changer 407 changes the resonant frequency of the closed space SC according to the detected operational environment temperature. More specifically, a control voltage is applied to the frequency changer 407 according to the detected operational environment temperature. The frequency changer 407 stretches or contracts in the directional-axis direction and the in-plane direction alike according to the applied control voltage.

The stretch or contraction in the directional-axis direction of the frequency changer 407 is absorbed by the elastic bonding layer 408. Therefore, a fluctuation in the resonant frequency of each of the case-side diaphragm 43a and the ultrasonic element 50 due to the stretch or contraction in the directional-axis direction of the frequency changer 407 is satisfactorily suppressed.

The dimension in the in-plane direction, that is, radial direction of the gap G varies depending on the stretch or contraction in the in-plane direction of the frequency changer 407. This causes the volume of the closed space SC to vary. Accordingly, the resonant frequency of the closed space SC changes. Thus, according to the foregoing constitution, the resonant frequency of the closed space SC can be controlled independently of the resonant frequencies of the case-side diaphragm 43a and the ultrasonic element 50 respectively.

Twelfth Embodiment

Figure 14:
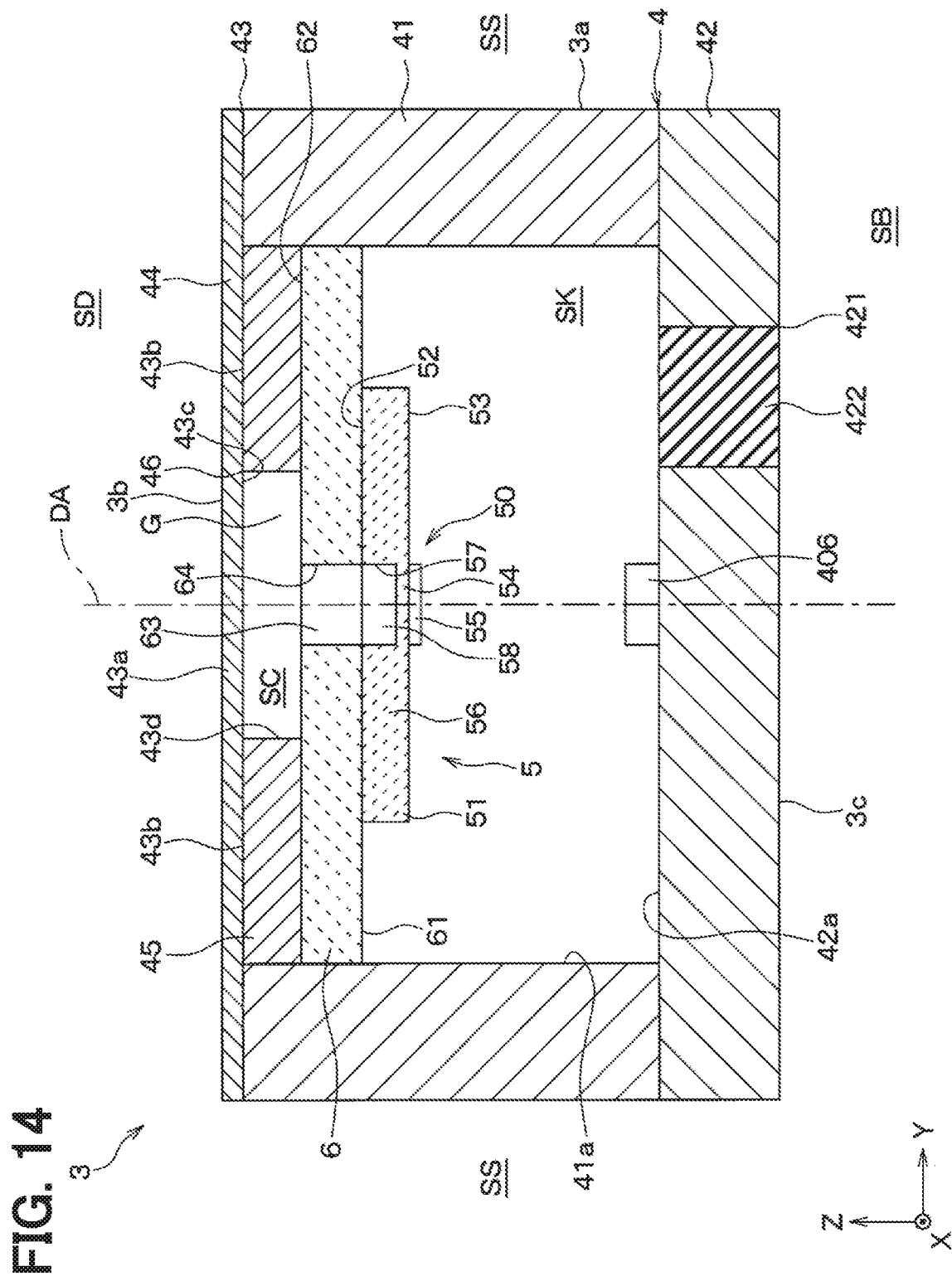
FIG. 14 is a sectional view showing an outline constitution of an ultrasonic microphone according to a twelfth embodiment.

Referring to FIG. 14, a twelfth embodiment will be described below. In the present embodiment, the element storage case 4 has an air vent 421. The air vent 421 allows the substrate back space SK inside the element storage case 4 and the case back space SB outside the element storage case 4 to communicate with each other. More specifically, the air vent 421 is a through hole piercing the inside baseplate 42 in the thickness direction, and opens on the outside bottom 3c and the inside bottom 42a.

The air vent 421 is liquid-tightly sealed so that passage of a liquid can be inhibited though air can pass. More specifically, in the example shown in FIG. 14, the air vent 421 is provided with an air vent sealant 422. The air vent sealant 422 is realized with a porous material through which air can pass but a liquid can hardly pass. The moisture absorbent 404 is stored in the element storage case 4.

According to the foregoing constitution, a gas can be transferred between the substrate back space SK inside the element storage case 4 and the case back space SB outside the element storage case 4. Accordingly, a volatile component of an adhesive bond can be discharged to outside the element storage case 4. Further, since the substrate back space SK located on an opposite side of the closed space SC with the element-side diaphragm 54 between the substrate back space and the element-side diaphragm is allowed to communicate with outside air, a resistance occurring when the element-side diaphragm 54 deforms is minimized and signal receiving sensitivity is upgraded. Further, since the air vent sealant 422 is included, entry of a liquid such as water to the element storage case 4 through the air vent 421 can be successfully inhibited.

Thirteenth Embodiment

Figure 15:
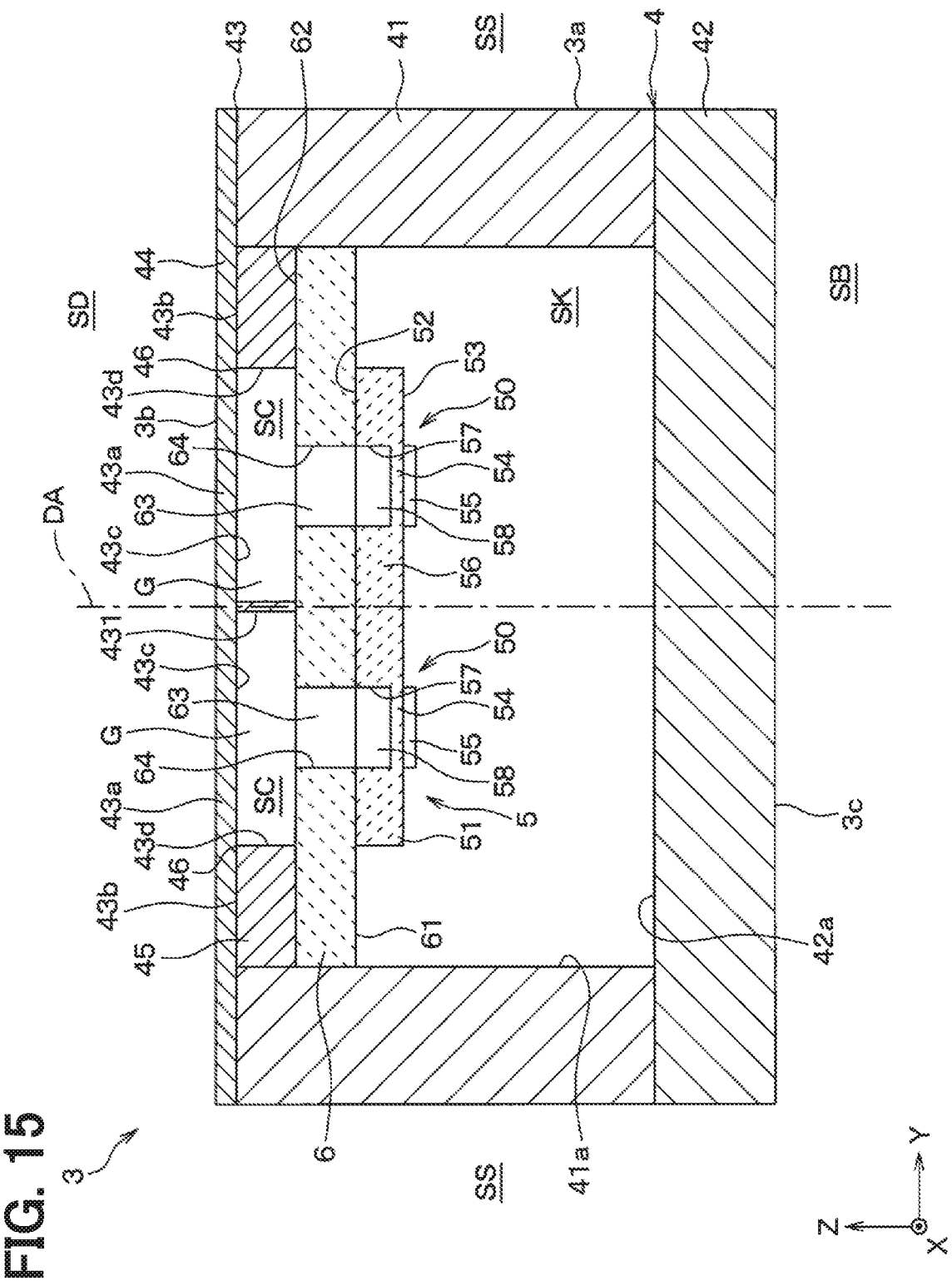
FIG. 15 is a sectional view showing an outline constitution of an ultrasonic microphone according to a thirteenth embodiment.

Referring to FIG. 15, a thirteenth embodiment will be described below. In the present embodiment, plural case-side diaphragms 43a, plural ultrasonic elements 50, and plural closed spaces SC are arrayed in the in-plane direction.

More specifically, a case-side partition 431 is included in the outside baseplate 43. The case-side partition 431 is a thick part of the outside baseplate 43 and is located at a position different from that of the case-side thick part 43b. Specifically, the case-side partition 431 is interposed between the two adjoining case-side diaphragms 43a in the in-plane direction. In other words, the case-side partition 431 is included to dissociate the plural case-side diaphragms 43a from each other in the in-plane direction.

The proximal end in the directional-axis direction of the case-side partition 431 abuts against the support substrate 6, and thereby the case-side partition is supported by the support substrate 6. The case-side partition 431 is an integral part of the diaphragm support part 45, and supports the diaphragm formation part 44 from the proximal side in the directional-axis direction. Specifically, the case-side partition 431 has the same dimension in the directional-axis direction as the case-side thick part 43b does.

In the present embodiment, plural gaps G dissociated from each other by the case-side partition 431 are arrayed in the in-plane direction. Each of the gaps G is located at a position coincident with each of the case-side diaphragms 43a in the in-plane direction.

The semiconductor substrate 51 includes the plural ultrasonic elements 50. Each of the ultrasonic elements 50 is located at a position coincident with each of the case-side diaphragms 43a in the in-plane direction. Specifically, plural pairs of the ultrasonic element 50 and the case-side diaphragm 43a which are associated with each other on a one-to-one basis are included.

The semiconductor substrate 51 includes plural element-side recessed parts 57. Each of the element-side recessed parts 57 is located at a position coincident with each of the case-side diaphragms 43a in the in-plane direction. Specifically, plural pairs of the element-side recessed part 57 and the case-side diaphragm 43a which are associated with each other on a one-to-one basis are included.

Plural communication holes 63 are formed in the support substrate 6. Each of the communication holes 63 is located at a position coincident with each of the case-side diaphragms 43a in the in-plane direction. Specifically, plural pairs of the communication hole 63 and the case-side diaphragm 43a which are associated with each other on a one-to-one basis are included. Further, plural pairs of the communication hole 63 and the gap G which are associated with each other on a one-to-one basis are included. Further, plural pairs of the communication hole 63 and the element-side hollow part 58 which are associated with each other on a one-to-one basis are included.

Plural closed spaces SC are formed in the ultrasonic microphone 3. Each of the closed spaces SC is located at a position coincident with each of the case-side diaphragms 43a in the in-plane direction. Specifically, plural pairs of the closed space SC and the case-side diaphragm 43a which are associated with each other on a one-to-one basis are included. One gap G and the communication hole 63 and the element-side hollow part 58 associated with the gap constitute each of the closed spaces SC.

According to the foregoing constitution, while the plural ultrasonic elements 50 are successfully protected, a feature as a sensor array using the ultrasonic elements (for example, an angle detection feature) can be satisfactorily realized. Plural sets of the ultrasonic element 50, the closed space SC, and the case-side diaphragm 43a are included. Therefore, when the frequency characteristics of the respective sets are mutually independently designed, a sophisticated feature such as a broadband can be realized.

Specifically, when the plural case-side diaphragms 43a are arrayed in the in-plane direction, the case-side diaphragms 43a may exhibit mutually different resonant frequencies. When the plural ultrasonic elements 50 are arrayed in the in-plane direction, the ultrasonic elements 50 may exhibit mutually different resonant frequencies. Further, when the plural closed space SC are arrayed in the in-plane direction, the closed spaces SC may exhibit mutually different resonant frequencies.

Fourteenth Embodiment

Figure 16:
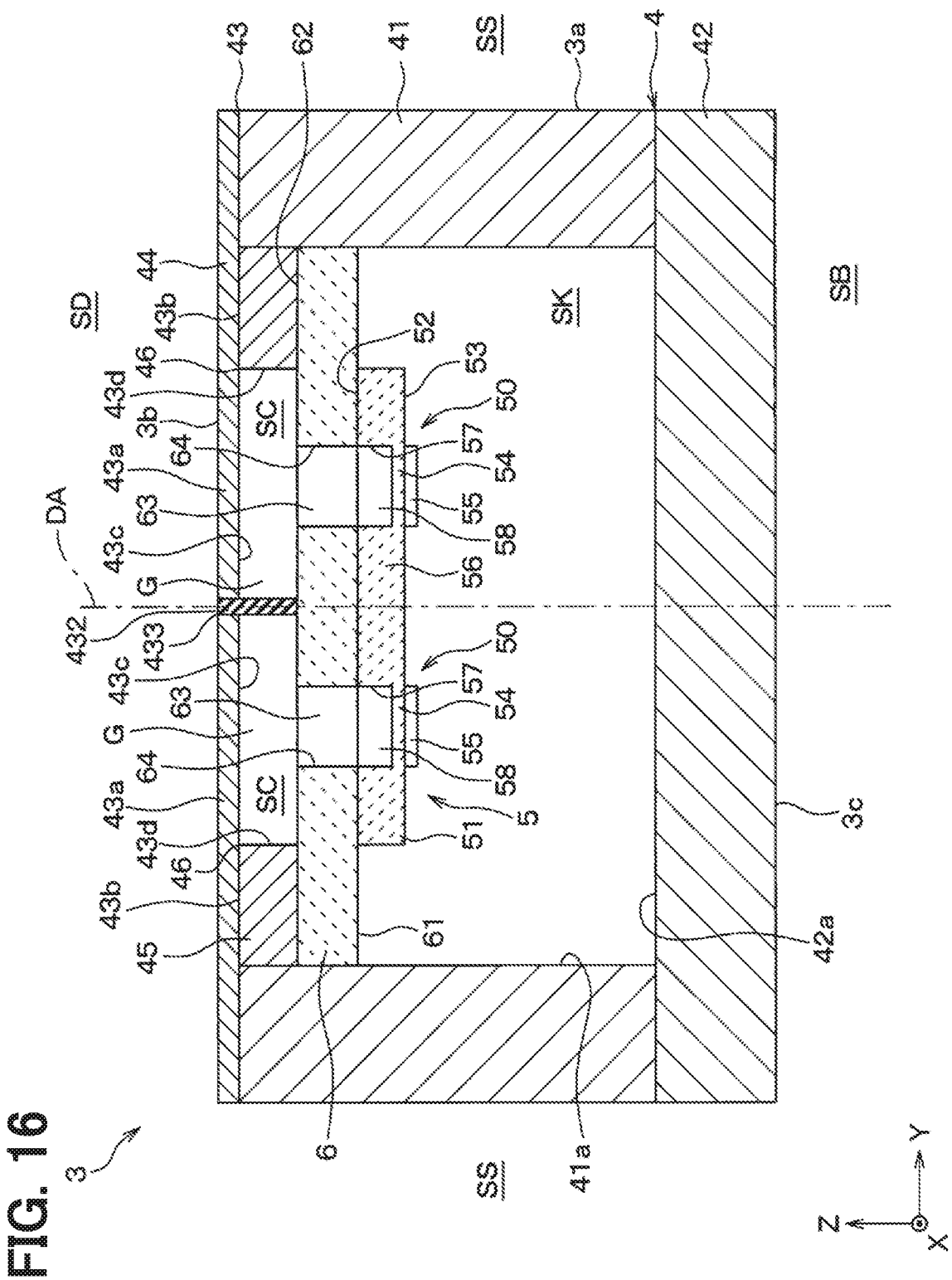
FIG. 16 is a sectional view showing an outline constitution of an ultrasonic microphone according to a fourteenth embodiment.

Referring to FIG. 16, a fourteenth embodiment will be described below. Even in the present embodiment, similarly to the thirteenth embodiment, the plural case-side diaphragms 43a, the plural ultrasonic elements 50, and the plural closed spaces SC are arrayed in the in-plane direction. As for the fourteenth embodiment, parts different from those of the thirteenth embodiment will be mainly described below.

In the present embodiment, a diaphragm dissociation member 432 is included in place of the case-side partition 431 shown in FIG. 15. The diaphragm dissociation member 432 is interposed between the two adjoining case-side diaphragms 43a in the in-plane direction.

The diaphragm dissociation member 432 dissociates, similarly to the case-side partition 431 shown in FIG. 15, the case-side diaphragms 43a from each other in the in-plane direction. Likewise, the diaphragm dissociation member 432 dissociates the gaps G from each other in the in-plane direction. Specifically, the diaphragm dissociation member 432 intervenes between the two adjoining gaps G in the in-plane direction.

Further, the diaphragm dissociation member 432 inhibits propagation of a vibration between the adjoining case-side diaphragms 43a in the event that the plural case-side diaphragms 43a are arrayed in the in-plane direction. More specifically, the diaphragm dissociation member 432 is made of a synthetic resin such as a synthetic rubber, and has a damping feature.

In the present embodiment, a dissociation member insertion hole 433 is formed at a position in the diaphragm formation part 44 coincident with the diaphragm dissociation member 432. The dissociation member insertion hole 433 is a through hole piercing the diaphragm formation part 44 in the thickness direction. The proximal end in the directional-axis direction of the diaphragm dissociation member 432 abuts against the support substrate 6, and thereby the diaphragm dissociation member is supported by the support substrate 6. The distal end in the directional-axis direction of the diaphragm dissociation member 432 is inserted into the dissociation member insertion hole 433. Part where the distal end in the directional-axis direction of the diaphragm dissociation member 432 is inserted into the dissociation member insertion hole 433 is airtightly and liquid-tightly sealed.

According to the foregoing constitution, propagation of a vibration between the case-side diaphragms 43a which adjoin in the in-plane direction can be successfully inhibited. Further, propagation of a vibration between the gaps G which adjoin in the in-plane direction can be successfully inhibited. Therefore, when plural sets of the ultrasonic element 50, the closed space SC, and the case-side diaphragm 43a are included, interference among the sets can be satisfactorily suppressed.

Fifteenth Embodiment

Figure 17:
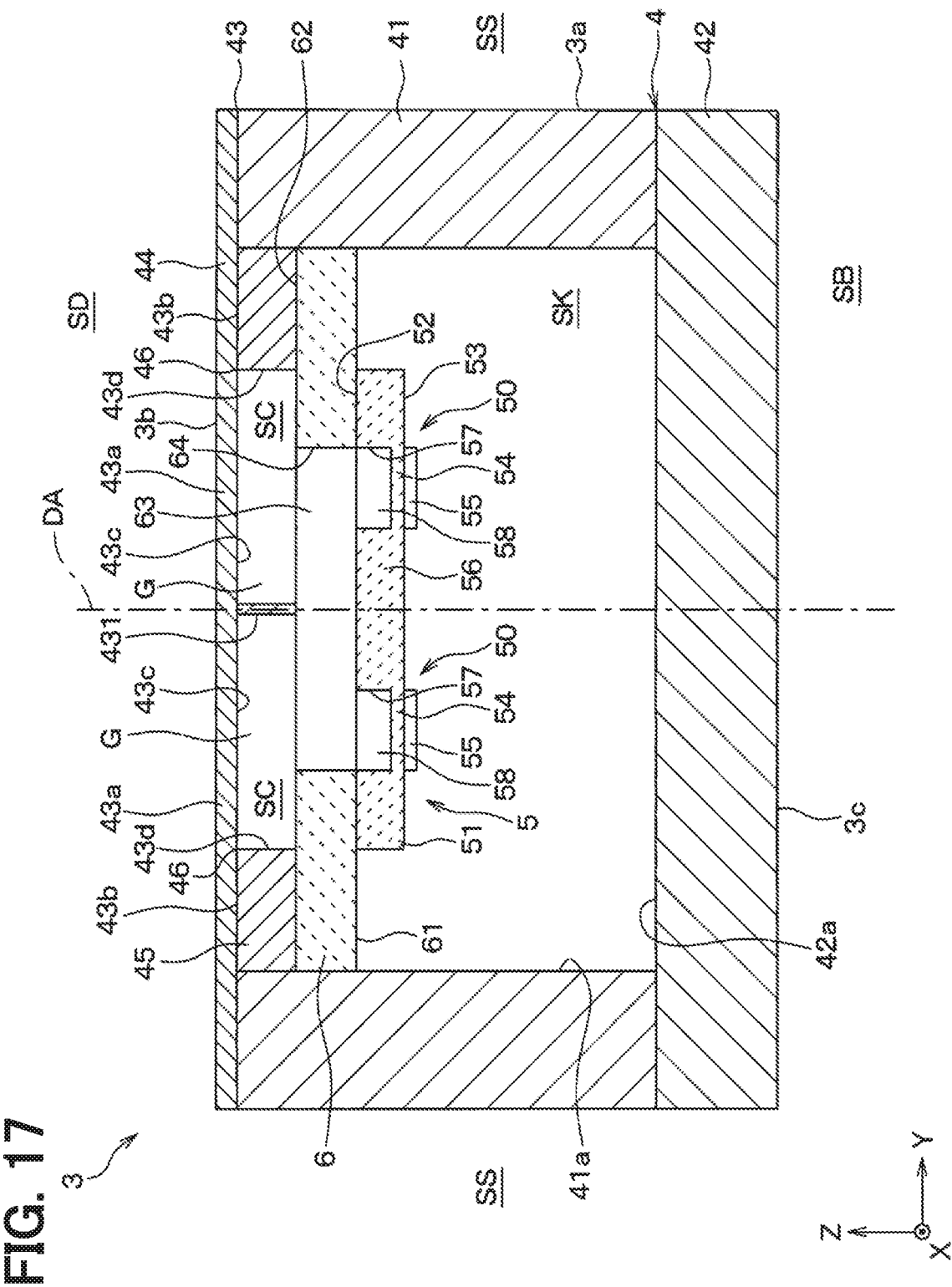
FIG. 17 is a sectional view showing an outline constitution of an ultrasonic microphone according to a fifteenth embodiment.

Referring to FIG. 17, a fifteenth embodiment will be described below. As for even the fifteenth embodiment, parts different from those of the thirteenth embodiment will be mainly described below.

Even in the present embodiment, similarly to the thirteenth embodiment, the plural case-side diaphragms 43a and the plural ultrasonic elements 50 are arrayed in the in-plane direction. Specifically, the plural gaps G and the plural element-side hollow part 58 are arrayed in the in-plane direction.

On one hand, in the present embodiment, the communication hole 63 is formed to overlie the gaps G. Further, the communication hole 63 overlies the element-side hollow parts 58. Specifically, the plural closed spaces SC adjoining in the in-plane direction communicate with each other through the communication hole 63. Otherwise, one closed space SC is bifurcated from the communication hole 63 into the gaps G and the element-side hollow parts 58 in the in-plane direction.

According to the foregoing constitution, although an interference suppression feature is slightly poorer than that of the fourteenth embodiment, the same advantageous effects as those of the thirteenth embodiments are exerted.

Sixteenth Embodiment

Figure 18:
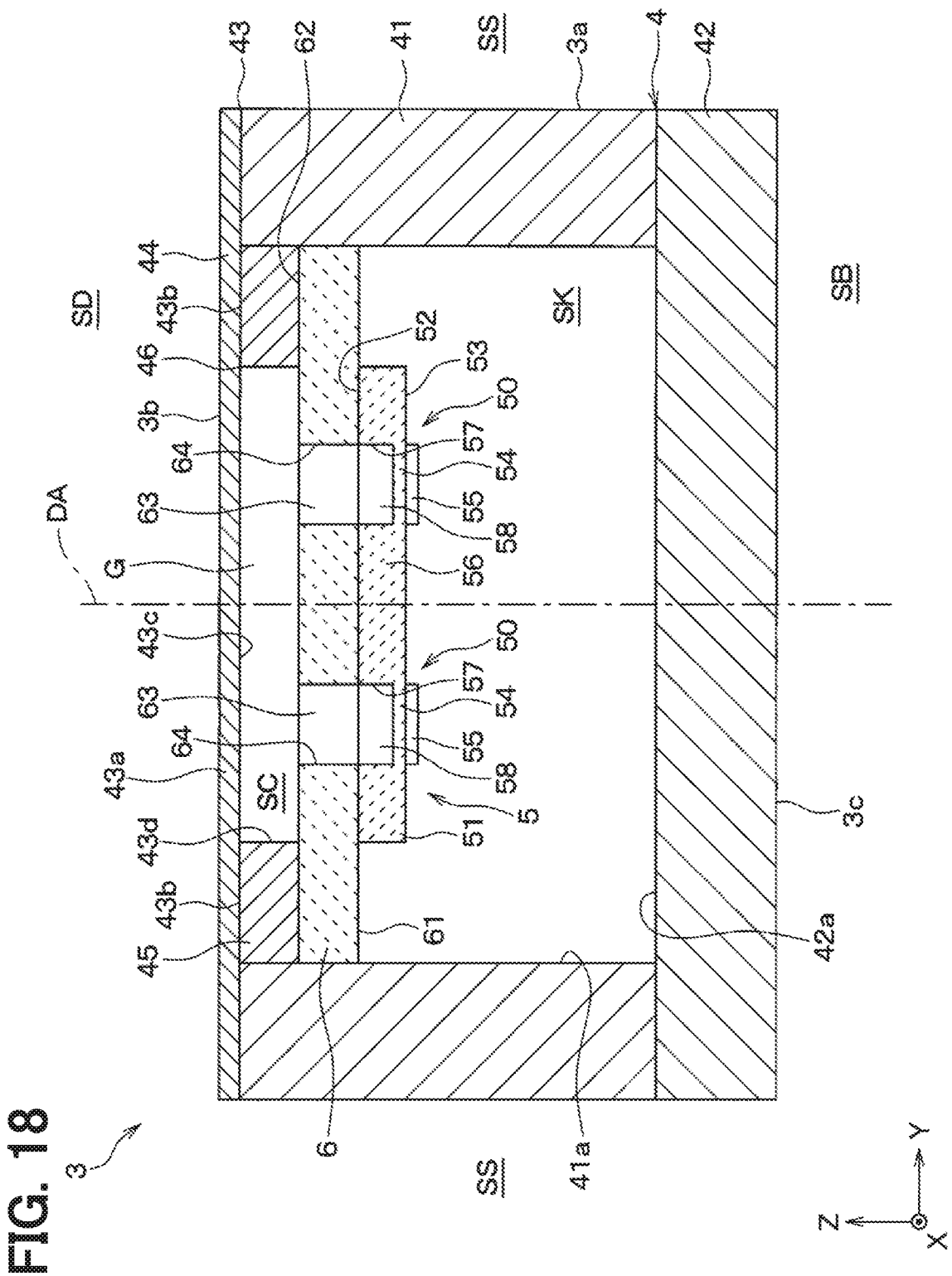
FIG. 18 is a sectional view showing an outline constitution of an ultrasonic microphone according to a sixteenth embodiment.

Referring to FIG. 18, a sixteenth embodiment will be described below. Even in the present embodiment, similarly to the thirteenth embodiment, the plural ultrasonic elements 50 are arrayed in the in-plane direction. Specifically, the plural element-side hollow parts 58 are arrayed in the in-plane direction. Further, the plural communication holes 63 are arrayed in the in-plane direction. The plural communication holes 63 communicate with the associated element-side recessed parts 57, that is, element-side hollow parts 58.

On one hand, in the present embodiment, the gap G is formed to overlie the plural ultrasonic elements 50. Likewise, the gap G overlies the plural communication holes 63. In other words, one closed space SC is bifurcated from the gap G into the plural communication holes 63 in the in-plane direction. Otherwise, plural closed spaces SC adjoining in the in-plane direction communicate with each other through the gap G.

According to the foregoing constitution, although the interference suppression feature is slightly poorer than that of the fourteenth embodiment, the same advantageous effects as those of the thirteenth embodiment are exerted.

Seventeenth Embodiment

Figure 19:
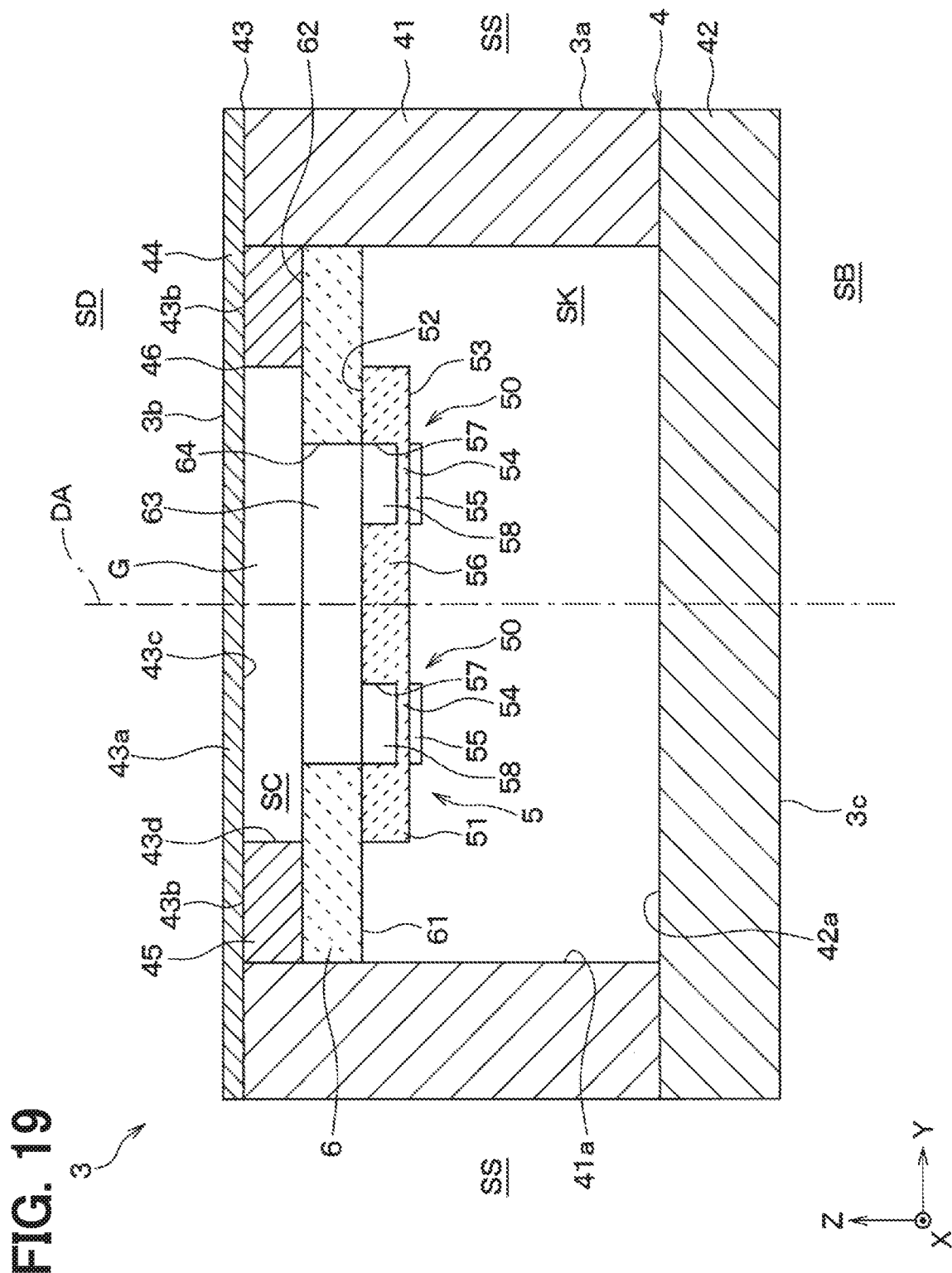
FIG. 19 is a sectional view showing an outline constitution of an ultrasonic microphone according to a seventeenth embodiment.

Referring to FIG. 19, a seventeenth embodiment will be described below. Even in the present embodiment, similarly to the thirteenth embodiment, the plural ultrasonic elements 50 are arrayed in the in-plane direction. Specifically, the plural element-side hollow parts 58 are arrayed in the in-plane direction.

On one hand, in the present embodiment, the gap G and the communication hole 63 are formed to overlie the plural ultrasonic elements 50. In other words, one closed space SC is bifurcated from the communication hole 63 into the element-side hollow parts 58.

According to the foregoing constitution, although the interference suppression feature is slightly poorer than that of the fourteenth embodiment, the same advantageous effects as those of the thirteenth embodiment are exerted.

Eighteenth Embodiment

Figure 20:
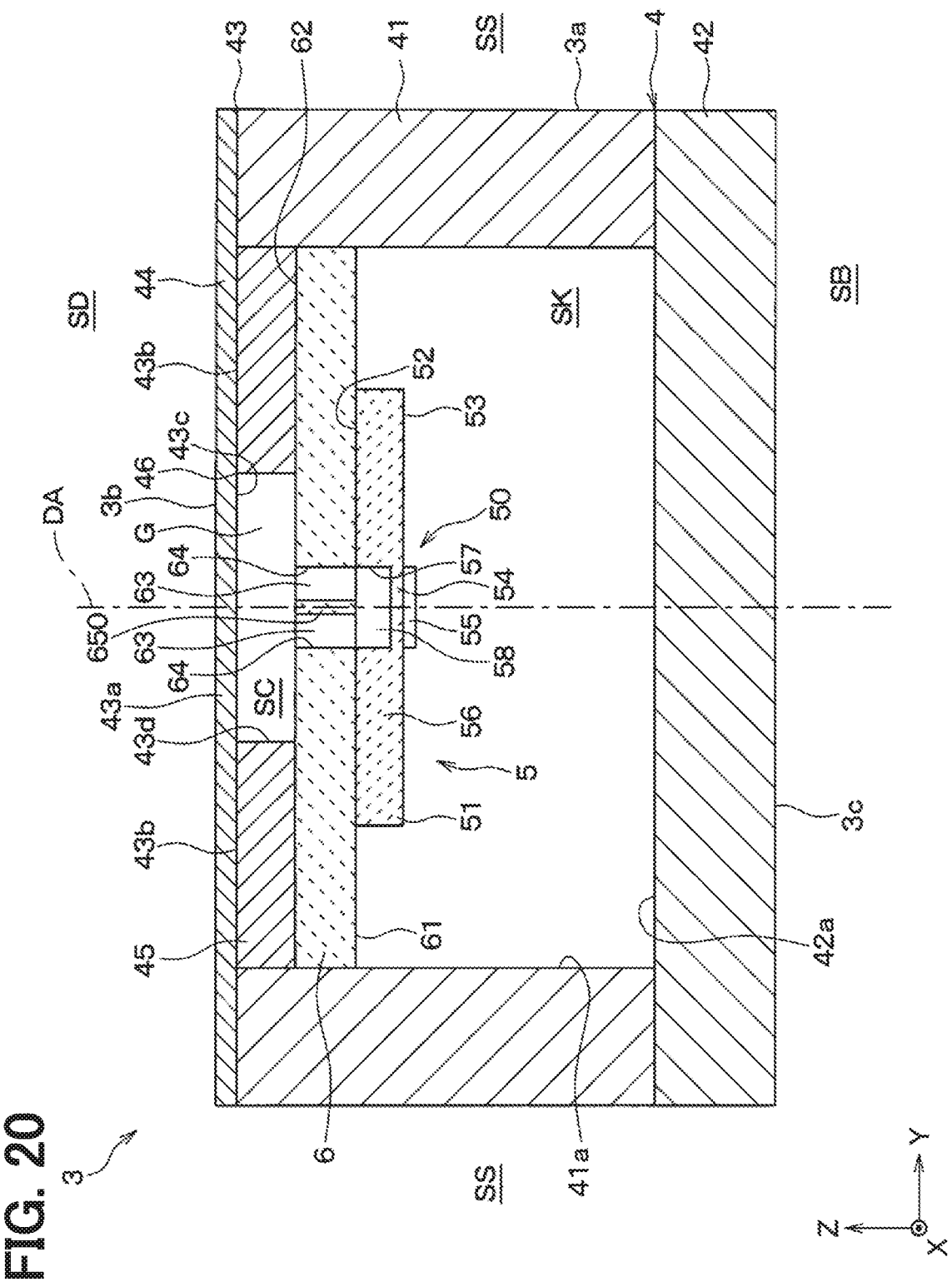
FIG. 20 is a sectional view showing an outline constitution of an ultrasonic microphone according to an eighteenth embodiment.

Referring to FIG. 20, an eighteenth embodiment will be described below.

In the present embodiment, two communication holes 63 adjoining in the in-plane direction are isolated from each other by a substrate-side partition 650. Specifically, the plural closed spaces SC adjoining in the in-plane direction communicate with each other through the gap G and the element-side hollow part 58. Otherwise, one closed space SC is bifurcated into the two communication holes 63 in the support substrate 6 in the in-plane direction.

According to the foregoing constitution, the resonant frequency of the closed space SC can be adjusted by adjusting design parameters including dimensions of the communication holes 63 and the substrate-side partition 650. Therefore, the resonant frequency of the closed space SC can be adjusted independently of the structural resonant frequencies of the element-side diaphragm 54 and the ultrasonic element 50 respectively.

Nineteenth Embodiment

Figure 21:
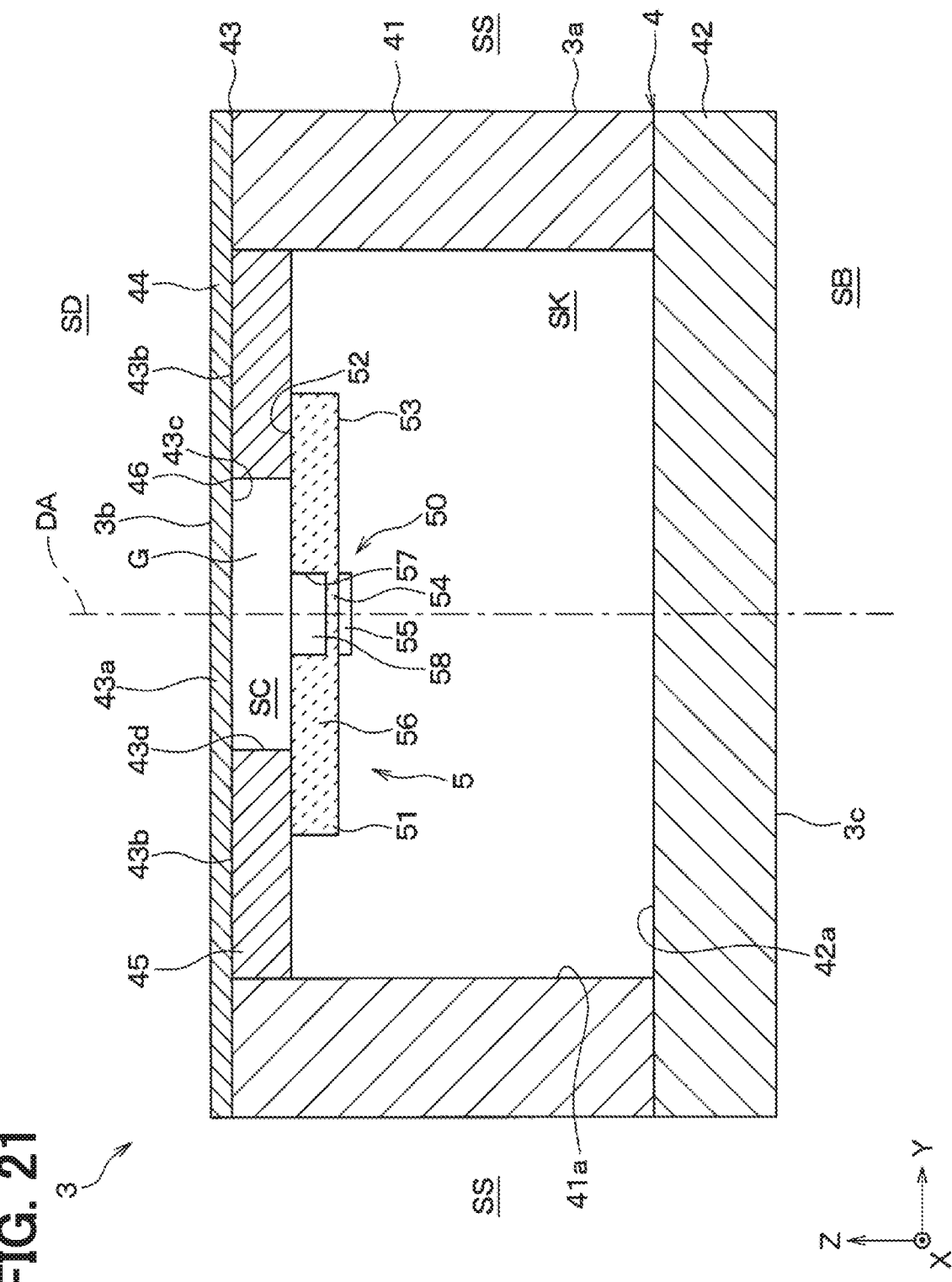
FIG. 21 is a sectional view showing an outline constitution of an ultrasonic microphone according to a nineteenth embodiment.

Referring to FIG. 21, a nineteenth embodiment will be described below. The present embodiment is equivalent to a constitution realized by excluding the support substrate 6 included in the first embodiment shown in FIG. 3. Specifically, in the present embodiment, the semiconductor substrate 51 is directly secured to the element storage case 4.

More specifically, referring to FIG. 21, the semiconductor substrate 51 is joined with the case-side thick part 43*b* of the outside baseplate 43 so that the element-side recessed part 57 adjoins and communicates with the gap G. The semiconductor substrate 51 is bonded to the case-side thick part 43*b* using an adhesive layer that is not shown, and is thus secured to the element storage case 4. Further, the element-side hollow part 58 that is a space inside the element-side recessed part 57, and the gap G constitute the closed space SC.

According to the present embodiment, the same advantageous effects as those of the first embodiment are attained by a simpler constitution.

Twentieth Embodiment

Figure 22:
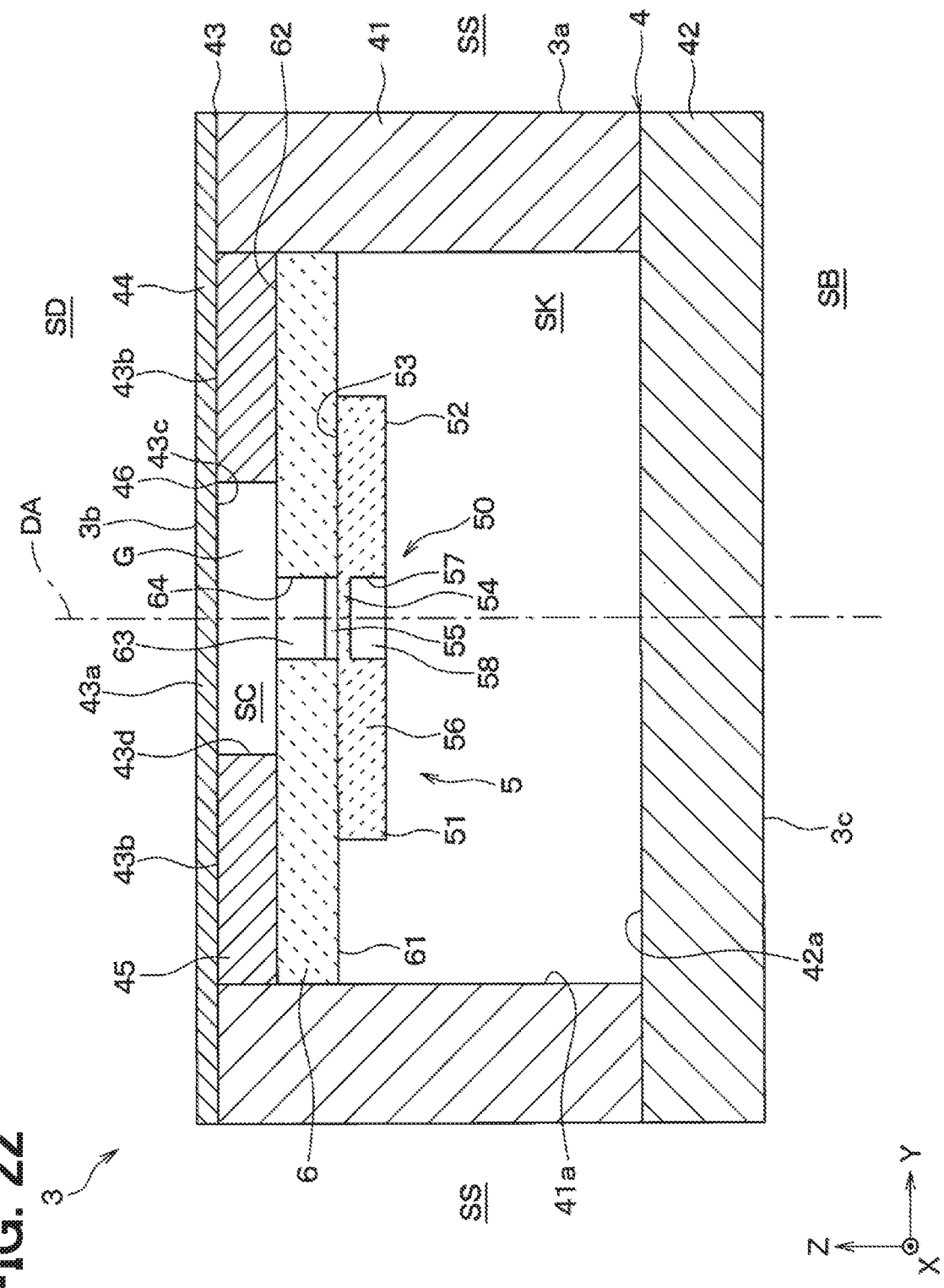
FIG. 22 is a sectional view showing an outline constitution of an ultrasonic microphone according to a twentieth embodiment.

Referring to FIG. 22, a twentieth embodiment will be described below. The present embodiment is equivalent to a constitution realized by changing the mounting posture of the semiconductor substrate 51 included in the first embodiment shown in FIG. 3.

Specifically, in the present embodiment, the semiconductor substrate 51 is joined with the support substrate 6 over the element support surface 53 using an adhesive layer that is not shown. The element-side recessed part 57 opens on the substrate back space SK, and thereby the element-side hollow part 58 communicates with the substrate back space SK but not with the communication hole 63.

As shown in FIG. 22, the closed space SC may not include the element-side hollow part 58. In other words, the gap G and the communication hole 63 may constitute the closed space SC.

Modifications

The present invention is not limited to the above embodiments. The embodiments can be appropriately modified. Typical modifications will be described below. As for the modifications, differences from the embodiments will be mainly described below. The same signs are assigned to parts identical to or homogeneous to each other between the embodiments and the modifications. Therefore, as for the modifications, unless a technological discrepancy is found or an additional explanation is exceptional, explanations concerning the embodiments are adapted to the constituent elements bearing the same signs as those of the embodiments.

An object in which the ultrasonic sensor 1 is mounted is not limited to the front bumper V3 and the rear bumper V4. More specifically, for example, the ultrasonic sensor 1 may be mounted in the body panel V2. Specifically, the mounting hole V5 may be formed in the body panel V2. Further, the ultrasonic sensor 1 is not limited to an onboard purpose. The ultrasonic sensor 1 is not limited to a clearance sonar. Specifically, the ultrasonic sensor 1 may be used for any other purpose.

The ultrasonic sensor 1 is not limited to a constitution capable of receiving and transmitting an ultrasonic wave. Specifically, the ultrasonic sensor 1 may have a constitution capable of merely originating an ultrasonic wave. Otherwise, the ultrasonic sensor 1 may only have a feature of receiving a reflected wave, which is returned from an object existing in the surroundings, of a probe wave that is an ultrasonic wave originating from any other ultrasonic originator.

The structures of parts of the ultrasonic sensor 1 are not limited to those in the above concrete examples. More specifically, for example, the outline of the ultrasonic microphone 3, that is, element storage case 4 is not limited to a substantially cylindrical shape, but may be a substantially regular hexagonal or octagonal shape.

A material made into the element storage case 4 is not limited to a metal material such as aluminum. Specifically, for example, the element storage case 4 may be made of a synthetic resin such as polycarbonate or polystyrene. Otherwise, the element storage case 4 may be made of carbon fibers or carbon fiber containing resin. Otherwise, at least part of the element storage case 4, for example, the case-side diaphragm 43*a* may be made of a material having a shape memory feature or super-elasticity feature. Accordingly, a resonant frequency change stemming from deformation due to a temperature change or external force can be satisfactorily suppressed.

The structure of the element storage case 4 is not limited to any special one as long as a technological disadvantage does not occur. More specifically, for example, the lateral plate 41 and the outside baseplate 43 may be formed seamlessly and integrally using the same material. Otherwise, the lateral plate 41 and the outside baseplate 43 may be made of different materials.

The shape in the in-plane direction of the case-side diaphragm 43*a* is not limited to the substantially circular one like the ones in the above concrete examples. Specifically, as for the shape in the in-plane direction of the case-side diaphragm 43*a*, an arbitrary shape, for example, a substantial rectangle, substantial ellipse, substantially regular hexagon, or substantially regular octagon can be adopted. Likewise, the sectional shape of the case-side diaphragm 43*a* is not limited to a tabular shape. More specifically, for example, the case-side diaphragm 43*a* may be formed like a curved plate jutting out towards the external space SD.

In FIG. 3, the case-side thick part 43*b* may be excluded. Specifically, the case-side diaphragm 43*a* may occupy almost the whole in the in-plane direction of the outside baseplate 43. According to the constitution, the thickness of the case-side diaphragm 43*a* needed to realize a predetermined resonant frequency can be made larger than that shown in FIG. 3. Accordingly, the intensity of the element storage case 4 is enhanced, More specifically, for example, the intensity of the element storage case 4 to be attained when the element storage case 4 is made of a lightweight material such as a synthetic resin can be satisfactorily enhanced.

The case-side diaphragm 43*a* and the case-side thick part 43*b* may be made of different materials. Likewise, the diaphragm formation part 44 and the diaphragm support part 45 may be made of different materials.

The diaphragm formation part 44 and the diaphragm support part 45 may be formed seamlessly and integrally.

The moisture absorbent 404 may be included in the constitutions shown in FIG. 3 to FIG. 6, FIG. 9 to FIG. 13, and FIG. 15 to FIG. 22. The moisture absorbent 404 may be incorporated in one of the closed space SC and the substrate back space SK.

The operational environment temperature of the ultrasonic sensor 1 is obtainable from the exterior of the ultrasonic sensor 1. More specifically, the operational environment temperature can be detected by any other temperature detection unit installed in the vehicle V. Therefore, the operational environment temperature may be received from an ECU. The temperature sensor 406 may therefore be excluded.

The structure and placement position of the frequency changer 407 are not limited to any special ones. Specifically, for example, the frequency changer 407 for changing the structural resonant frequency of the case-side diaphragm 43*a* and is shown in FIG. 10 may be located at any position other than the bare surface 3*b*. More specifically, the frequency changer 407 may be included in, for example, the distal end in the directional-axis direction of the laterally outer wall surface 3*a*. Otherwise, the frequency changer 407 may be included in, for example, the junction between the diaphragm formation part 44 and the diaphragm support part 45 included in the case-side thick part 43*b*.

The frequency changer 407 for changing the structural resonant frequency of the ultrasonic element 50 is not limited to the one included in the above concrete example. Specifically, for example, the frequency changer 407 may be a heater.

The frequency changer 407 for changing the resonant frequency of the closed space SC is not limited to the one included in the above concrete example. Specifically, for example, the frequency changer 407 is not limited to a piezoelectric element that deforms when subjected to voltage application. The frequency changer 407 may be designed to change the dimension in the directional-axis direction of the gap G.

The type of ultrasonic element 50 is not limited to any special one. Specifically, for example, the ultrasonic element 50 is not limited to a PMUT. The ultrasonic element 50 may have a constitution as a CMUT. Herein, CMUT stands for Capacitive Micromachined Ultrasonic Transducer.

Securing the support substrate 6 to the element storage case 4 may be achieved on the lateral plate 41.

The support substrate 6 may be a printed circuit board. Specifically, various circuit components for use in signal processing may be mounted on the mounting surface 61.

The support substrate 6 may not be a printed circuit board. Specifically, various circuit components for use in signal processing may be mounted on the semiconductor substrate 51. Otherwise, the circuit components may be mounted on a control circuit board that is not shown and included inside the case main unit 2*a*.

Two or all of the eighth embodiment shown in FIG. 10, the tenth embodiment shown in FIG. 12, and the eleventh embodiment shown in FIG. 13 can be combined mutually.

The constitutions shown in FIG. 4 to FIG. 14 can be adapted to the array type constitutions shown in FIG. 15 to FIG. 20.

In the above embodiments, the closed space SC is formed as an airtightly and liquid-tightly sealed space. However, the present invention is not limited to the mode. Specifically, as long as the performance of propagating an ultrasonic vibration between the ultrasonic element 50 and the case-side diaphragm 43*a* is satisfactorily obtained, strict airtightness in the closed space SC is not demanded. However, when a liquid such as water enters the closed space SC, the volume of the closed space SC diminishes and the resonant frequency fluctuates accordingly. The liquid such as water that has entered brings about deterioration. Therefore, the closed space SC is preferably formed as at least a liquid-tightly sealed space.

In FIG. 3 and others, the closed space SC is formed so that the spatial sectional area varies in the directional-axis direction. However, the present invention is not limited to the mode. Specifically, as long as an ultrasonic vibration can propagate between the case-side diaphragm 43*a* and the element-side diaphragm 54 owing to linkage resonance, the distribution in the directional-axis direction of the spatial sectional area of the closed space SC is not limited to any special one. Noted that when the spatial sectional area of the closed space SC is made constant irrespective of a position in the directional-axis direction, design freedom diminishes. In contrast, when the distribution in the directional-axis direction of the spatial sectional area of the closed space SC is made adjustable, the design freedom for realizing a desired drive frequency and directional angle enhances.

The plural case-side diaphragms 43*a* may be arrayed in the in-plane direction so that the resonant frequencies of some of the case-side diaphragms 43*a* agree with one another. Even in this case, "agreement" encompasses as mentioned above substantial agreement. The plural case-side diaphragms 43*a* may be included so that at least some of the case-side diaphragms exhibit mutually different resonant frequencies. Likewise, the plural ultrasonic elements 50 may be included so that at least some of the ultrasonic elements exhibit mutually different resonant frequencies. The plural closed spaces SC may be included so that at least some of the closed spaces exhibit mutually different resonant frequencies.

In the above description, plural constituent elements that are formed seamlessly and integrally may be formed by bonding mutually separate members. Likewise, plural constituent elements formed by bonding mutually separate members may be formed seamlessly and integrally.

In the above description, plural constituent elements made of the same material may be made of mutually different materials. Likewise, plural constituent elements made of mutually different materials may be made of the same material.

The elements constituting any of the above embodiments are, needless to say, not always indispensable except that the elements are specified to be especially indispensable or thought to be clearly indispensable in principle. When a numeral such as the number of constituent elements, a numerical value, a quantity, or a range is referred to, the present invention is not limited to the specific numeral except that the number of constituent elements, numerical value, quantity, or range is specified to be especially indispensable or clearly limited to the specific numeral in principle. Likewise, when the shape of a constituent element, a direction, or a positional relationship is referred to, the present invention is not limited to the shape, direction, or positional relationship except that the shape, direction, or positional relationship is specified to be especially indispensable or is limited to a specific shape, direction, or positional relationship in principle.

The modifications are also not limited to the above exemplifications. For example, as an exemplification other than the above ones, the plural embodiments can be combined with one another unless the combination is technologically discrepant. Likewise, the plural modifications can be combined with one another unless the combination is technologically discrepant.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An ultrasonic sensor comprising:
   an element storage case including at least one case-side diaphragm that is a vibration plate having a thickness direction along a directional axis; and
   at least one ultrasonic element accommodated in the element storage case and spaced apart from the case-side diaphragm, wherein:
   the ultrasonic element includes an element-side diaphragm that is a vibration film having the thickness direction along the directional axis and provided by a thin part of a semiconductor substrate having the thickness direction along the directional axis;
   the semiconductor substrate is arranged to provide at least one closed space as a resonant space between the case-side diaphragm and the element-side diaphragm; and
   the semiconductor substrate is fixed and supported by the element-storage case, wherein:
   a resonant frequency of the ultrasonic element is defined as a first resonant frequency;
   a resonant frequency of the closed space is defined as a second resonant frequency;
   a resonant frequency of the case-side diaphragm is defined as a third resonant frequency;
   the first to third resonant frequencies are substantially equal to each other;
   wherein:
   a maximum difference among a difference between the first resonant frequency and the second resonant frequency, a difference between the second resonant frequency and the third resonant frequency and a difference between the first resonant frequency and the third resonant frequency is defined as $\Delta fr$;
   a bandwidth of a widest resonance band among a resonance band of the ultrasonic element, a resonance band of the closed space and a resonance band of the case-side diaphragm is defined as BW; and
   an equation of $\Delta fr \leq BW$ is satisfied.

2. The ultrasonic sensor according to claim 1, wherein:
   the element storage case includes a side plate having a cylinder shape surrounding the directional axis, and an outer base plate that liquid-tightly seals one end of the side plate;
   the case-side diaphragm is provided by a thin part of the outer base plate arranged at a center of the outer base plate in an on-plane direction intersecting the directional axis; and
   the semiconductor substrate is fixed and supported by a case-side thick part of the outer base plate disposed in a periphery of the case-side diaphragm.

3. The ultrasonic sensor according to claim 2, further comprising:
   a support substrate having the thickness direction along the directional axis and arranged between the outer base plate and the semiconductor substrate, wherein:
   the support substrate is connected to the case-side thick part of the outer base plate, and is fixed to the element storage case;
   the semiconductor substrate is connected to the support substrate, and is fixed to the support substrate;
   the support substrate has a communication hole that is a through hole penetrating the support substrate to communicate with a gap between the case-side diaphragm and the support substrate; and
   the gap and the communication hole provide the closed space.

4. The semiconductor sensor according to claim 3, wherein:
   the semiconductor substrate includes an element-side recessed part that is a concavity arranged at a position corresponding to the element-side diaphragm in the on-plane direction to be surrounded by an element-side thick part of the ultrasonic element adjacent to the element-side diaphragm in the on-plane direction;
   the semiconductor substrate is connected to the support substrate, and the element-side recessed part is adjacent to and communicates with the communication hole; and
   an element-side hollow part that is a space inside the element-side recessed part, the gap, and the communication hole provide the closed space.

5. The ultrasonic sensor according to claim 2, wherein:
   the semiconductor substrate includes an element-side recessed part that is a concavity arranged at a position corresponding to the element-side diaphragm in the on-plane direction to be surrounded by an element-side thick part of the ultrasonic element adjacent to the element-side diaphragm in the on-plane direction;
   the semiconductor substrate is connected to the case-side thick part of the outer base plate, and the element-side recessed part is adjacent to and communicates with the gap,
   the semiconductor substrate is accommodated in the element storage case; and
   an element-side hollow part that is a space inside the element-side recessed part and the gap provide the closed space.

6. The ultrasonic sensor according to claim 1, wherein:
the closed space has a cross-sectional area orthogonal to the directional axis; and
the cross-sectional area varies along a directional-axis direction parallel to the directional axis.

7. The ultrasonic sensor according to claim 1, further comprising:
a damper accommodated in the closed space.

8. The ultrasonic sensor according to claim 1, wherein:
the at least one case-side diaphragm includes a plurality of case-side diaphragms arrayed in an on-plane direction intersecting the directional axis, the at least one ultrasonic element includes a plurality of ultrasonic elements arrayed in an on-plane direction intersecting the directional axis, or the at least one closed space includes a plurality of closed spaces arrayed in an on-plane direction intersecting the directional axis.

9. The ultrasonic sensor according to claim 8, further comprising:
a diaphragm separation member arranged between adjacent case-side diaphragms, wherein:
the diaphragm separation member restricts propagation of a vibration between the adjacent case-side diaphragms when the at least one case-side diaphragm includes the plurality of case-side diaphragms arrayed in an on-plane direction intersecting the directional axis.

10. The ultrasonic sensor according to claim 8, wherein:
in a case where the at least one case-side diaphragm includes a plurality of case-side diaphragms arrayed in an on-plane direction intersecting the directional axis, each of the plurality of case-side diaphragms have different resonant frequencies;
in a case where the at least one ultrasonic element includes a plurality of ultrasonic elements arrayed in an on-plane direction intersecting the directional axis, each of the plurality of ultrasonic elements have different resonant frequencies; and
in a case where the at least one closed space includes a plurality of closed spaces arrayed in an on-plane direction intersecting the directional axis, each of the plurality of closed spaces have different resonant frequencies.

11. The ultrasonic sensor according to claim 1, further comprising:
a volume adjustment part for adjusting a volume of the closed space, wherein:
the volume adjustment part is a projection, a tapered part, or a recessed part arranged to face the closed space at a position different from a diaphragm back surface ($43c$) that is an internal surface of the case-side diaphragm facing the closed space.

12. The ultrasonic sensor according to claim 1, further comprising:
a slit arranged at one end of the element storage case on a side of the case-side diaphragm in a directional-axis direction parallel to the directional axis.

13. The ultrasonic sensor according to claim 12, wherein:
the slit is air-tightly and liquid-tightly sealed by a sealant.

14. The ultrasonic sensor according to claim 1, further comprising:
a moisture absorbent accommodated in the element storage case.

15. The ultrasonic sensor according to claim 1, wherein:
the element storage case includes a substrate back space arranged on a side opposite to the closed space with sandwiching the semiconductor substrate between the substrate back space and the closed space, and an air vent opening for communicating the substrate back space and a case back space outside the element storage case with each other;
the air vent opening is liquid-tightly sealed to restrict a liquid from passing through the air vent opening; and
air passes through the air vent opening.

16. The ultrasonic sensor according to claim 1, further comprising:
a frequency changer that changes a vibrational frequency of the ultrasonic element, the closed space, or the case-side diaphragm according to an operational environment temperature of the ultrasonic sensor.

17. The ultrasonic sensor according to claim 1, wherein:
a resonant frequency of each of the ultrasonic element, the closed space, and the case-side diaphragm is disposed in a range between 30 kHz and 100 kH.

18. The ultrasonic sensor according to claim 1, wherein:
the case-side diaphragm has an external surface defined as a bare surface intersecting the directional axis;
the bare surface is exposed to an external space of a vehicle through a through hole of an outer plate of a vehicle body when the ultrasonic sensor is mounted in the vehicle body of the vehicle; and
the case-side diaphragm has a thickness of 0.5 mm or more.

\* \* \* \* \*